United States Patent
Cann et al.

(10) Patent No.: US 11,124,456 B2
(45) Date of Patent: Sep. 21, 2021

(54) METHODS OF IDENTIFYING AND PREPARING A CERAMIC MATERIAL EXHIBITING AN ELECTRIC FIELD INDUCED STRAIN

(71) Applicants: David Cann, Corvallis, OR (US);
Brady Gibbons, Corvallis, OR (US);
Peter Mardilovich, Cambridge (GB)

(72) Inventors: David Cann, Corvallis, OR (US);
Brady Gibbons, Corvallis, OR (US);
Peter Mardilovich, Cambridge (GB)

(73) Assignee: XAAR TECHNOLOGY LIMITED, Cambridge (GB)

( * ) Notice: Subject to any disclaimer, the term of this patent is extended or adjusted under 35 U.S.C. 154(b) by 0 days.

(21) Appl. No.: 16/483,604

(22) PCT Filed: Feb. 2, 2018

(86) PCT No.: PCT/GB2018/050306
§ 371 (c)(1),
(2) Date: Aug. 5, 2019

(87) PCT Pub. No.: WO2018/142151
PCT Pub. Date: Aug. 9, 2018

(65) Prior Publication Data
US 2020/0095169 A1 Mar. 26, 2020

(30) Foreign Application Priority Data
Feb. 3, 2017 (GB) .................................... 1701830

(51) Int. Cl.
*C04B 35/46* (2006.01)
*C04B 35/468* (2006.01)
(Continued)

(52) U.S. Cl.
CPC ........ *C04B 35/4682* (2013.01); *C04B 35/475* (2013.01); *H01L 41/1871* (2013.01);
(Continued)

(58) Field of Classification Search
CPC . C04B 35/4682; C04B 35/475; C04B 35/462; C04B 35/465; C04B 2235/765;
(Continued)

(56) References Cited

U.S. PATENT DOCUMENTS

2012/0187325 A1 7/2012 Hoffmann et al.

FOREIGN PATENT DOCUMENTS

KR 101318088 B1 10/2013
KR 101333793 B1 11/2013
(Continued)

OTHER PUBLICATIONS

Raengthon et al. High temperature electronic properties of BaTiO3—Bi(Zn1/2Ti1/2)O3—BiInO3 for capacitor applications. J Electroceram (2012) 28:165-171.*
(Continued)

*Primary Examiner* — Noah S Wiese
(74) *Attorney, Agent, or Firm* — Finnegan, Henderson, Farabow, Garrett & Dunner LLP

(57) ABSTRACT

The present invention relates to a method for identifying a solid solution ceramic material of a plurality of perovskite compounds which exhibits an electric field induced strain derived from a reversible phase transition, as well as a method for making such ceramic materials and ceramic materials obtainable therefrom. In particular, the present invention is directed to a method of identifying a solid solution ceramic material of at least three perovskite compounds which exhibits an electric field induced strain derived from a reversible phase transition; said method comprising the steps of: i) determining a molar ratio of at
(Continued)

least one tetragonal perovskite compound to at least one non-tetragonal perovskite compound which, when combined to form a solid solution, provides a ceramic material comprising a major portion of a tetragonal phase having an axial ratio c/a of greater than 1.005 to 1.04; and ii) determining a molar ratio of at least one additional non-tetragonal perovskite compound to the combination of perovskite compounds from step i) at the determined molar ratio which, when combined to form a solid solution, provides a ceramic material comprising a major portion of a pseudo-cubic phase having an axial ratio c/a of from 0.995 to 1.005 and/or a rhombohedral angle of 90±0.5 degrees.

20 Claims, 10 Drawing Sheets

(51) Int. Cl.
    *C04B 35/475*     (2006.01)
    *H01L 41/187*     (2006.01)
(52) U.S. Cl.
    CPC ...... *H01L 41/1878* (2013.01); *C01P 2002/34* (2013.01); *C04B 2235/762* (2013.01); *C04B 2235/765* (2013.01); *C04B 2235/81* (2013.01)
(58) Field of Classification Search
    CPC ...... C04B 2235/3298; C04B 2235/761; H01L 41/1871; C01P 2002/34; C01P 2002/50
    See application file for complete search history.

(56) References Cited

FOREIGN PATENT DOCUMENTS

| KR | 101635941 B1 | 7/2016 |
|---|---|---|
| WO | WO2012044309 | 4/2012 |
| WO | WO2012044313 | 4/2012 |
| WO | WO2014116244 | 7/2014 |

OTHER PUBLICATIONS

Rushman et al. The Permittivity of Polycrystalsof the Perovskite Type. Transactions of the Faraday Society, vol. 42, 1946.*
Search Report dated Jul. 25, 2017, from the United Kingdom Intellectual Property Office for corresponding United Kingdom Application No. GB1701830.0. (4 pgs.).
Search Report dated Sep. 22, 2017, from the United Kingdom Intellectual Property Office for corresponding United Kingdom Application No. GB1701830.0. (5 pgs.).
Ullah, Aman, Chang Won Ahn, and Ill Won Kim. "Phase transition, microstructure and electric-field-induced large strain in Bi0. 5 (Na0. 85K0. 15) 0.5 TiO3—BiAlO3 lead-free piezoelectric ceramics." physica status solidi (a) 207.11 (2010): 2578-2584.
Zheng, Donggeng, and Ruzhong Zuo. "Relaxor-normal ferroelectric phase transition and significantly enhanced electromechanical strain behavior in Bi (Ni1/2Ti1/2) O3—PbTiO3—Pb (Mg1/3Nb2/3) O3 ternary system close to the morphotropic phase boundary." Journal of the European Ceramic Society 35.13 (2015): 3485-3493.
Jo, Wook, et al. "Giant electric-field-induced strains in lead-free ceramics for actuator applications—status and perspective." Journal of Electroceramics 29.1 (2012): 71-93.
Bai, Wangfeng, et al. "Composition-and temperature-driven phase transition characteristics and associated electromechanical properties in Bi 0.5 Na 0.5 TiO 3-based lead-free ceramics." Dalton Transactions 45.20 (2016): 8573-8586.
Raengthon, N. et al., "High temperature electronic properties of BaTio—Bi(ZnTi)0-BiIn0for capacitor application", Journal of Electroceramics, Kluwer Academic Publishers, vol. 28, No. 2-3, Mar. 11, 2012, pp. 165-171.
Ullah, A. et al., "Phase transitions and large electric field-induced strain in BiAl03-modified Bi0.5(Na,K)0.5Ti03 lead-free piezoelectric ceramics", Current Applied Physics, vol. 10, No. 4, Feb. 12, 2010, pp. 1174-1181.
Hussain, A. et al., "Field-induced strain and polarization response in lead-free Bil/2(Na0.80K0.20)1/2TiO3—SrZr03 ceramics", Materials Chemistry and Physics, vol. 143, No. 3, Feb. 1, 2014 (Feb. 1, 2014), pp. 1282-1288.
International Search Report and Written Opinion for International Application No. PCT/GB2018/050306 dated Apr. 24, 2017 (11 pages).

* cited by examiner

METHODS OF IDENTIFYING AND PREPARING A CERAMIC MATERIAL EXHIBITING AN ELECTRIC FIELD INDUCED STRAIN

This application is a National Stage Entry of International Application No. PCT/GB2018/050306, filed Feb. 2, 2018, which is based on and claims the benefit of foreign priority under 35 U.S.C. § 119 to GB Application No. 1701830.0, filed Feb. 3, 2017. The entire contents of the above-referenced applications are expressly incorporated herein by reference.

The present invention relates to a method for identifying a solid solution ceramic material of a plurality of perovskite compounds which exhibits an electric field induced strain derived from a reversible phase transition, as well as a method for making such ceramic materials and ceramic materials obtainable therefrom. In particular, the methods of the present invention include determining molar ratios of at least one tetragonal perovskite and at least one non-tetragonal phase which provides a solid solution ceramic material which may undergo an electric field induced reversible phase change from a pseudo-cubic phase to a tetragonal phase.

Actuator materials are needed to generate electric-field induced strains for a wealth of devices including, for instance, mechanical relays, digital cameras, and ink-jet printers. The composition and crystal structure of the actuator material are critical to determining the actuator characteristics. Common actuator materials include piezoelectric materials which undergo physical changes in shape when exposed to an external electric field. However, dielectric materials that do not necessarily exhibit the piezoelectric effect may also potentially find application as actuators.

In principle, all dielectric materials exhibit electrostriction, which is characterised by a change in shape under the application of an electric field. Electrostriction is caused by displacement of ions in the crystal lattice upon exposure to an external electric field; positive ions being displaced in the direction of the field and negative ions displaced in the opposite direction. This displacement accumulates throughout the bulk material and results in an overall macroscopic strain (elongation) in the direction of the field. Thus, upon application of an external electric field, the thickness of a dielectric material will be reduced in the orthogonal directions characterized by Poisson's ratio. Electrostriction is known to be a quadratic effect, in contrast to the related effect of piezoelectricity, which is primarily a linear effect observed only in a certain class of dielectrics.

The critical performance characteristics for an actuator material include the effective piezoelectric coefficient, $d_{33}^*$, the temperature dependence of $d_{33}^*$ and the long-term stability of $d_{33}^*$ in device operation. Lead zirconate titanate (PZT), $Pb(Zr_xTi_{1-x})O_3$, and its related solid solutions, are a well-known class of ceramic perovskite piezoelectric materials that have found use in a wide variety of applications utilising piezoelectric actuation. However, as a result of emerging environmental regulations, there has been a drive to develop new lead-free actuator materials.

Significant attention has been given to electric field induced strain behaviour of alternative lead-free dielectric materials for potential actuator applications, examples of which include $(K,Na)NbO_3$-based materials, $(Ba,Ca)(Zr,Ti)O_3$-based materials and $(Bi,Na,K)TiO_3$-based materials. Ceramics with the perovskite structure have been of particular interest in this regard. The constituent atoms allow the unit cell to deform easily, giving rise to various ferro-electrically-active non-cubic perovskite phases such as those with tetragonal, rhombohedral, orthorhombic or monoclinic symmetry. The relatively large spatial tolerance for substitutional atoms is beneficial for chemical modifications, enabling functional properties to be tailored. When an external electric field is applied, these perovskite-structured ceramics are deformed with the changes in their macroscopic polarisation state.

The perovskite compound bismuth sodium titanate $(Bi_{0.5}Na_{0.5})TiO_3$ ("BNT") has, in particular, been studied extensively in the pursuit of lead-free actuator materials, including solid solutions of BNT with other components intended to enhance BNT's dielectric and piezoelectric properties. WO 2012/044313 and WO 2012/044309 describe a series of lead-free piezoelectric materials based on ternary compositions of BNT and $(Bi_{0.5}K_{0.5})TiO_3$ ("BKT") in combination with $(Bi_{0.5}Zn_{0.5})TiO_3$ ("BZT"), $(Bi_{0.5}Ni_{0.5})TiO_3$ ("BNiT"), or $(Bi_{0.5}Mg_{0.5})TiO_3$ ("BMgT"). WO 2014/116244 also describes ternary compositions of $BiCoO_3$ together with perovskites such as $BaTiO_3$ ("BT"), $(Na,K)NbO_3$ ("KNN"), BNT and BKT.

Perovskite ceramic materials which exhibit giant electrostrains have become a growing focus for potential actuator applications. A giant electric-field induced strain was, for example, found in the case of the BNT-BT-KNN perovskite ceramic system which was considered a particularly interesting discovery in the pursuit of lead-free ceramics which may compete with PZT in actuator applications. There has been speculation that desirable giant electrostrains, such as that exhibited by BNT-BT-KNN, may be attributed to a reversible phase transformation from a disordered ergodic (non-polar) relaxor state to a long-range non-ergodic (polar) ferroelectric ordered state in certain perovskite ceramics driven by an external electric field, as discussed in J Electroceram (2012) 29: 71-93. The characteristics of the giant strain in the BNT-BT-KNN perovskite ceramic system are, for instance, illustrated by composition dependent strain hysteresis loops in FIG. 9 of J Electroceram (2012) 29: 71-93.

In J Electroceram (2012) 29: 71-93 it is indicated that the giant electrostrains exhibited via the piezoelectric effect are the result of a strain-generating phase transition and that such a phenomenon extends the opportunities for actuator applications in a new manner. Furthermore, it is also said that BNT-based systems exhibiting giant electric-field-induced strains have the potential to replace PZT in the realm of actuator applications provided that certain challenges can be overcome, such as relatively large driving electric fields and frequency dependence, as well as temperature instability.

Bai et al., Dalton Trans., 2016, 45, 8573-8586, describe a lead-free BNT-BT-BZT ceramic system and how the addition of BZT to a solid solution of BNT-BT has a strong impact on the phase transition characteristics and electromechanical properties, as confirmed by X-ray diffraction (XRD) measurements, Raman spectra analysis and temperature-dependent changes in polarisation and strain hysteresis loops. Bai et al. describe that the addition of BZT "disrupts" the ferroelectric order to create a "non-polar" phase at zero electric field. On the application of an electric field, the BNT-BT-BZT ceramic material transitions from a pseudo-cubic mixture of tetragonal and rhombohedral structures to a purely rhombohedral phase.

There remains a need for a method for identifying alternative perovskite ceramic materials which exhibit giant electrostrains associated with a phase transition mechanism for use in actuator applications and without the deficiencies associated with large electric field and frequency dependence and/or temperature instability. The present invention is based on the discovery of a method for identifying and preparing ceramic materials which exhibit giant electrostrains and other properties which make them particularly suitable for use in actuator applications.

SUMMARY

Thus, in a first aspect, the present invention relates to a method of identifying a solid solution ceramic material of at least three perovskite compounds which exhibits an electric field induced strain derived from a reversible phase transition; said method comprising the steps of:
  i) determining a molar ratio of at least one tetragonal perovskite compound to at least one non-tetragonal perovskite compound which, when combined to form a solid solution, provides a ceramic material comprising a major portion of a tetragonal phase having an axial ratio c/a of between 1.005 and 1.04; and
  ii) determining a molar ratio of at least one additional non-tetragonal perovskite compound to the combination of perovskite compounds from step i) at the determined molar ratio which, when combined to form a solid solution, provides a ceramic material comprising a major portion of a pseudo-cubic phase having an axial ratio c/a of from 0.995 to 1.005 and/or a rhombohedral angle of 90±0.5 degrees.

In another aspect, the present invention relates to a method of identifying a solid solution ceramic material of at least two perovskite compounds which exhibits an electric field induced strain derived from a reversible phase transition; said method comprising the steps of:
  1) selecting a tetragonal perovskite compound suitable for forming a ceramic material comprising a major portion of a tetragonal phase having an axial ratio c/a of between 1.005 and 1.04;
  2) determining a molar ratio of the tetragonal perovskite compound from step 1) to at least one non-tetragonal perovskite compound which, when combined to form a solid solution, provides a ceramic material comprising a major portion of a pseudo-cubic phase having an axial ratio c/a of from 0.995 to 1.005 and/or a rhombohedral angle of 90±0.5 degrees.

The invention also provides methods for preparing a solid solution ceramic material of at least one tetragonal perovskite compound and at least one non-tetragonal perovskite compound which exhibits an electric field induced strain derived from a reversible phase transition from a pseudo-cubic phase to a tetragonal phase, as well as solid solution ceramic materials obtainable therefrom.

The invention also provides a solid solution ceramic material of at least one tetragonal perovskite compound and at least one non-tetragonal perovskite compound, wherein the ceramic material exhibits an electric field induced strain derived from a reversible phase transition from a pseudo-cubic phase to a tetragonal phase, as well as an actuator component and droplet deposition apparatus comprising the same.

DETAILED DESCRIPTION

Figure 1:
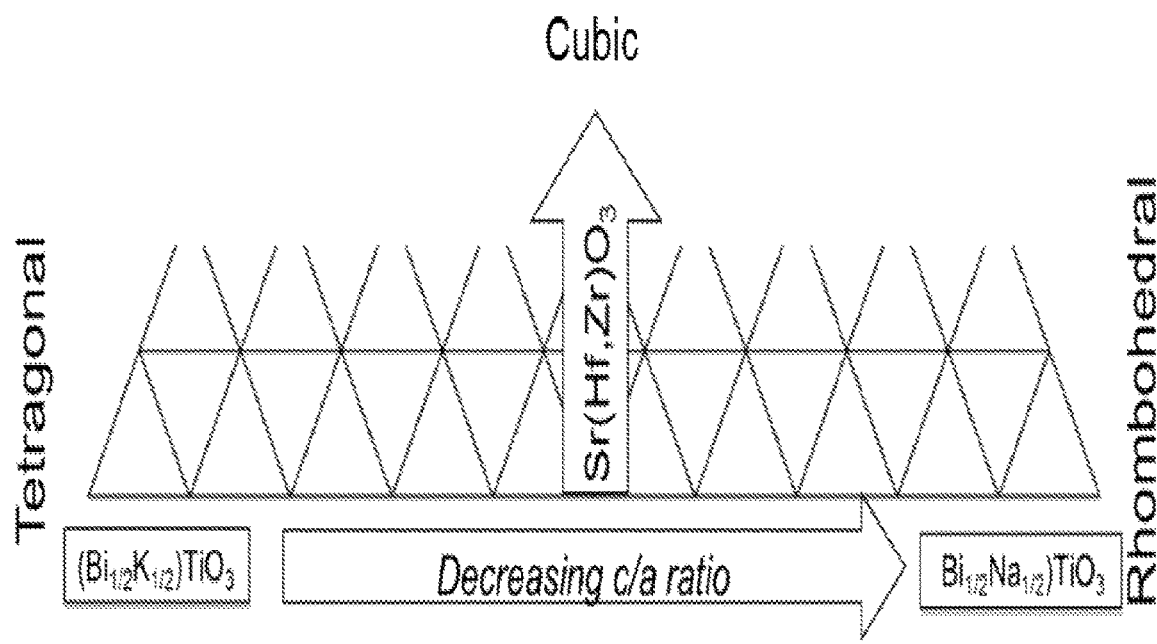
FIG. 1: shows a phase diagram for a solid solution of BNT-BKT-Sr(Hf,Zr)$O_3$ and the effect on symmetry in varying the molar fraction of the perovskite compound constituents.
Figure 2:
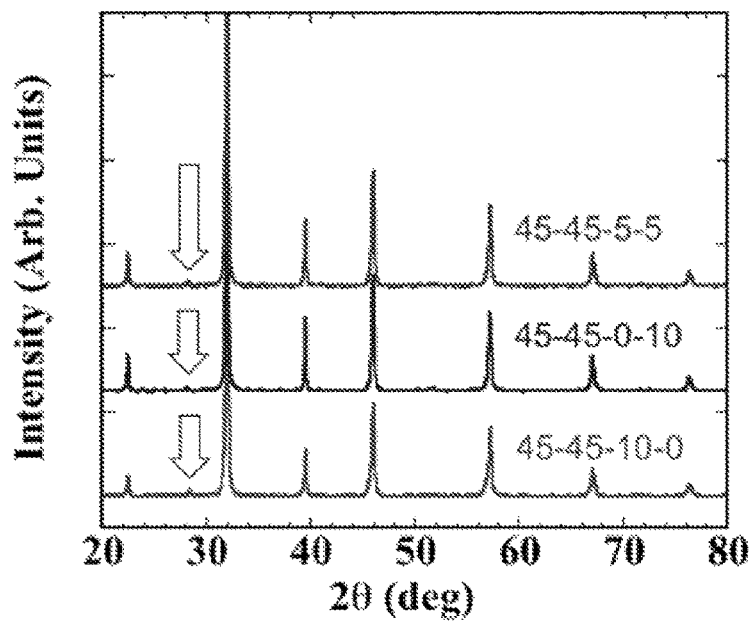
FIG. 2: shows XRD diffractograms for BNT-BKT-SrHfO$_3$—SrZrO$_3$ ceramics having mole fractions of: i) 45-45-10-0; ii) 45-45-0-10; and iii) 45-45-5-5.
Figure 3A:
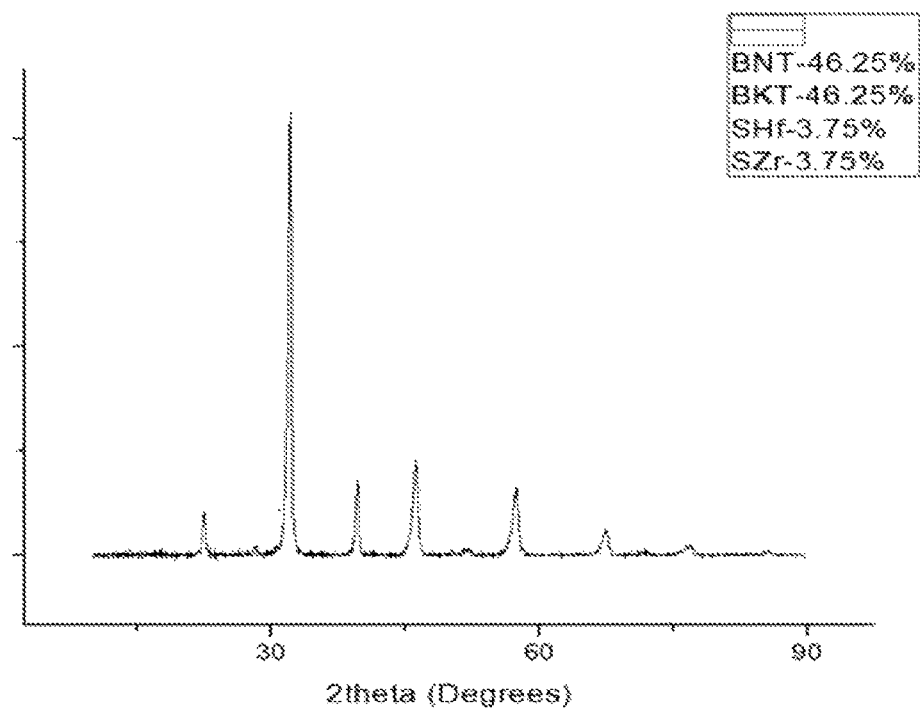
FIGS. 3a-b: show XRD diffractograms for BNT-BKT-SrHfO$_3$—SrZrO$_3$ ceramics having mole fractions of: a) 46.5-46.5-3.75-3.75; and b) 46.5-46.5-0-7.5.
Figure 3B:
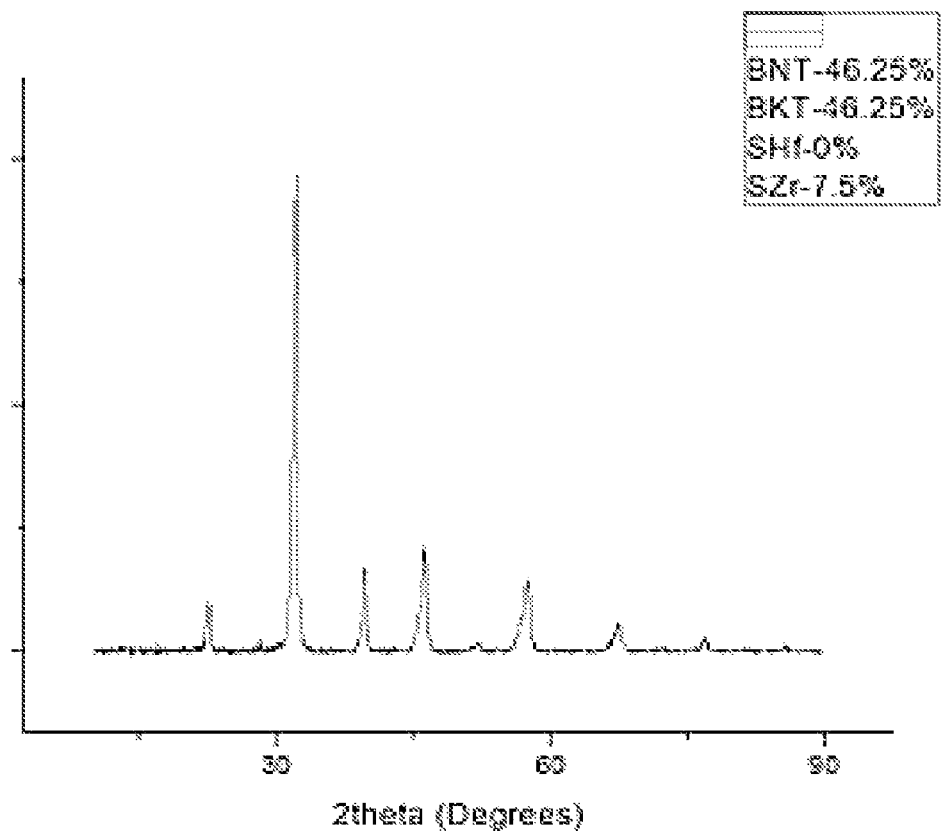
Figure 4:
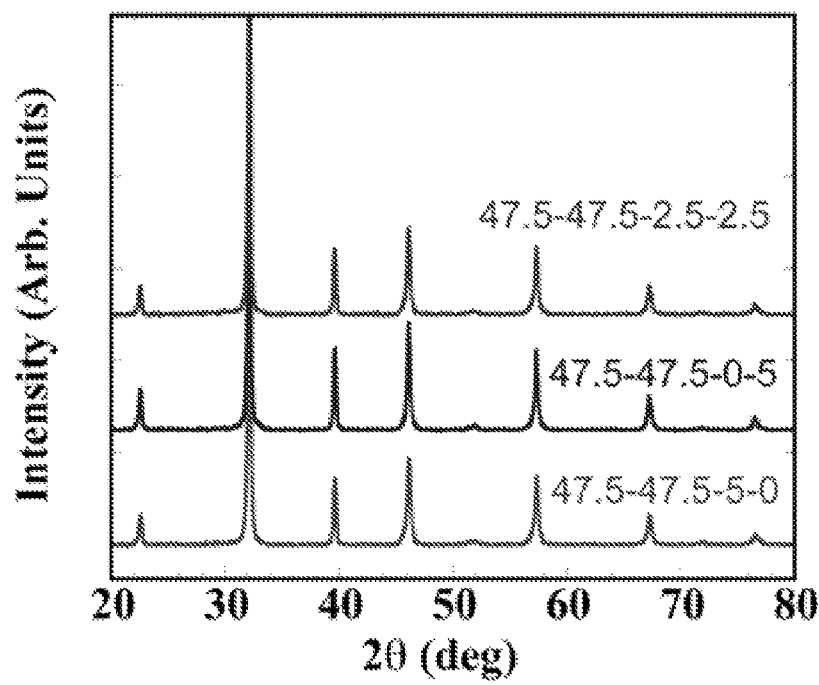
FIG. 4: shows XRD diffractograms for BNT-BKT-SrHfO$_3$—SrZrO$_3$ ceramics having mole fractions of: i) 47.5-47.5-2.5-2.5; ii) 47.5-47.5-0-5; and iii) 47.5-47.5-5-0.
Figure 5A:
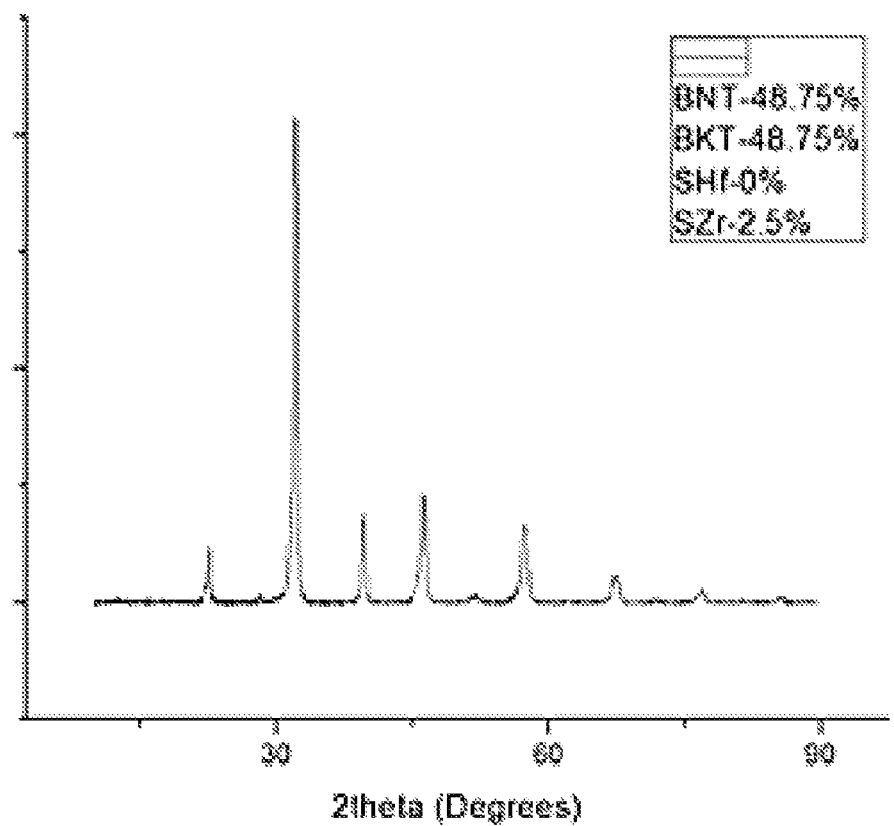
FIGS. 5a-b: show XRD diffractograms for BNT-BKT-SrHfO$_3$—SrZrO$_3$ ceramics having mole fractions of: a) 48.75-48.75-0-2.5; and b) 48.75-48.75-1.25-1.25.
Figure 5B:
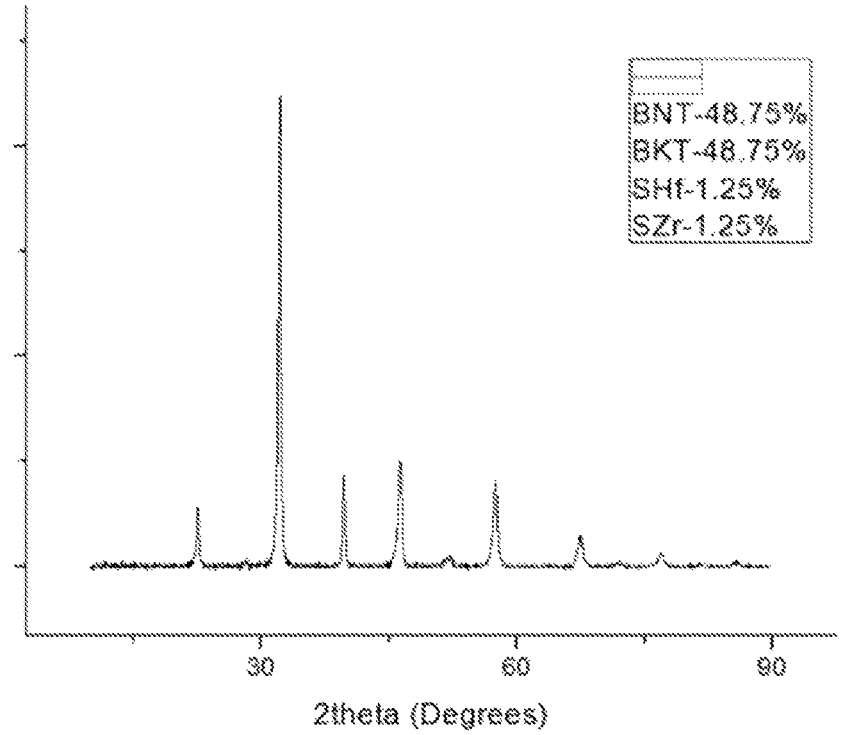

It has been surprisingly found by the inventors that particularly advantageous ceramic materials exhibiting giant electrostrain may be identified and prepared based on a selection of constituent perovskite compounds having particular symmetry which, when combined to form a solid solution, are capable of electric field induced strains as a result of a phase transition, in particular from a pseudo-cubic phase to a tetragonal phase. This corresponds to a form of "cross-over" or "relaxor-to-ferroelectric transition" mechanism through which an electric field may be used to induce strain.

Generally, in order to prepare a ceramic material which exhibits the particular desirable phase transition, it has been found by the inventors to be advantageous to modify a solid solution ceramic material exhibiting a tetragonal phase ("parent phase") by incorporating one or more additional perovskite compounds ("disorder phase") into the solid solution. The addition of the disorder phase acts to disrupt the long range tetragonal order of the parent phase (i.e. the long range electric dipolar order underpinning the tetragonal phase) such that the resulting ceramic material exhibits a pseudo-cubic phase in the absence of an applied electric field. When an electric field is applied to the ceramic material having the pseudo-cubic phase, a giant electrostrain may be observed which is associated with a transition from the pseudo-cubic phase to the tetragonal phase associated with the parent phase.

It has been found by the inventors to be particularly advantageous to provide a parent phase which has a tetragonal phase having an axial ratio c/a of between 1.005 and 1.04 (i.e. greater than 1.005 and less than 1.04). The axial ratio c/a is defined based on the lattice parameters of the perovskite unit cell, specifically as the length of crystallographic (001) axis (c) divided by the (100) axis (a). The desired axial ratio c/a may be achieved by combining perovskite compounds forming the parent phase in certain molar ratios. In that regard, phase and crystal structure, including the axial ratio c/a of a ceramic material, may be readily identified using X-ray diffraction (XRD) analysis, for instance, employing Cu Kα radiation.

The axial ratio c/a of the parent phase has an impact on the magnitude of the strain generated though the electric field induced phase transition. A parent tetragonal phase having an axial ratio c/a of between 1.005 and 1.04 has been found to be particularly useful based on overall polarisation and strain level. Where too large an axial ratio c/a is associated with the parent phase, the electric field induced transition may be difficult to obtain (e.g. require a high coercive field). In contrast, where too small an axial ratio c/a is associated with the parent phase, the overall induced strain from the phase transition may be too small. A parent phase having an axial ratio c/a of between 1.005 and 1.04 has been found by the inventors to give rise to a large electric field induced strain at practical field levels, for example at approximately 10 to 30 kV/cm.

The parent phase having the desired axial ratio c/a may be readily prepared as a solid solution of a tetragonal perovskite compound and a non-tetragonal perovskite compound, such as a low-tolerance factor perovskite compound (e.g. a cubic, orthorhombic, monoclinic, or rhombohedral perovskite compound). As is well known, the perovskite tolerance factor is essentially a geometric parameter which describes the relative packing density of the A- and B-sites in the perovskite structure, "$ABX_3$". Thus, the non-tetragonal perovskite compound may be included in a solid solution with the tetragonal perovskite compound in an appropriate molar ratio which affords the desired axial ratio c/a for the parent phase. This may be verified by XRD analysis of compositions of the tetragonal perovskite compound and the non-tetragonal perovskite compound (i.e. representative of the parent phase) wherein the compounds are present at a particular molar ratio. This same molar ratio of the tetragonal perovskite compound to the non-tetragonal perovskite compound can then be used for the preparation of a solid solution ceramic material in accordance with the invention which further comprises the disorder phase. This means that the resulting solid solution ceramic material is capable of an electric field induced reversible phase transition from the pseudo-cubic phase to the tetragonal phase associated with the parent phase.

Alternatively, the parent phase having the desired axial ratio c/a may be provided by a single tetragonal perovskite compound.

In order to benefit from electric field induced strain, the present invention relies on a phase transition as part of a "cross-over" or "relaxor-to-ferroelectric transition" mechanism. A ceramic material exhibiting such properties may be prepared by the introduction of a disorder phase into the parent phase to form a solid solution with a modified crystal structure. This is illustrated in FIG. 1, which shows a phase diagram for the solid solution of $BNT-BKT-Sr(Hf,Zr)O_3$, and illustrates the effects of varying the mole fractions of perovskite components associated with parent and disorder phases. In particular, the disorder phase is added to the parent phase at a molar ratio sufficient to disrupt the long range tetragonal order of the parent phase such that the resulting solid solution ceramic material exhibits a pseudo-cubic phase, where a pseudo-cubic phase is defined herein as having an axial ratio c/a of from 0.995 to 1.005 and/or a rhombohedral angle of 90±0.5 degrees.

Specifically, the disorder phase which is utilised in accordance with the present invention derives from at least one non-tetragonal perovskite compound which generally has dissimilar properties to the tetragonal perovskite compound of the parent phase and is able to provide cations to the solid solution which populate the A- and B-sites of the perovskite structure. The difference in properties between the cations associated with the tetragonal perovskite compound of the parent phase and those of the disorder phase can result in a cumulative effect of changing the overall symmetry of the solid solution from tetragonal/polar to pseudo-cubic/non-polar.

The resulting ceramic material may then exhibit an electric field induced strain associated with the transition from the pseudo-cubic/non-polar phase to the tetragonal/polar phase on the application of an electric field. By identifying the essential features associated with providing a ceramic material capable of providing giant electrostrains by means of a cross-over mechanism (i.e. reversible phase change), the present invention provides a means to identify alternative ceramic materials that have particular use in actuator applications.

In an aspect of the present invention, the parent phase discussed hereinbefore may contain at least one tetragonal perovskite compound and at least one non-tetragonal perovskite compound. This allows more scope for the properties of the parent phase to be tuned as desired, which can lead to benefits for fabrication for actuator applications, whilst retaining the essential characteristics of the parent phase in terms of symmetry.

Thus, the present invention provides a method of identifying a solid solution ceramic material of at least three perovskite compounds which exhibits an electric field induced strain derived from a reversible phase transition; said method comprising the steps of:
 i) determining a molar ratio of at least one tetragonal perovskite compound to at least one non-tetragonal perovskite compound which, when combined to form a solid solution, provides a ceramic material comprising a major portion of a tetragonal phase having an axial ratio c/a of between 1.005 and 1.04; and
 ii) determining a molar ratio of at least one additional non-tetragonal perovskite compound to the combination of perovskite compounds from step i) at the determined molar ratio which, when combined to form a solid solution, provides a ceramic material comprising a major portion of a pseudo-cubic phase having an axial ratio c/a of from 0.995 to 1.005 and/or a rhombohedral angle of 90±0.5 degrees.

The term "tetragonal perovskite compound" used herein refers to a compound with a perovskite structure which exhibits tetragonal symmetry. In contrast, the term "non-tetragonal perovskite compound" used herein refers to a compound with a perovskite structure which exhibits symmetry which is non-tetragonal (e.g. cubic, rhombohedral, orthorhombic or monoclinic symmetry).

As will be appreciated by the skilled person, the solid solution ceramic materials described herein exhibit an electric field induced strain derived from a reversible phase transition have a pseudo-cubic phase with an axial ratio c/a of from 0.995 to 1.005 and/or a rhombohedral angle of 90±0.5 degrees at zero electric field and under standard conditions of temperature and pressure (i.e. 25° C. and 1.01 bar (101 kPa)). Similarly, where a ceramic material corresponding to a parent phase is discussed herein, this material has a tetragonal phase with an axial ratio c/a of between 1.005 and 1.04 under standard conditions of temperature and pressure (i.e. 25° C. and 1.01 bar (101 kPa)).

The term "solid solution" used herein refers to a mixture of two or more crystalline solids that combine to form a new crystalline solid, or crystal lattice that is composed of a combination of the elements of the constituent compounds. As will be appreciated, the solid solution ceramic materials referred to herein may consist essentially of its constituent crystalline compounds as well as dopants and inevitable impurities. The solid solution exists over a partial or complete range of proportions or mole ratios of the constituent compounds, where at least one of the constituent compounds may be considered to be the "solvent" phase.

The term "dopant" used herein refers to a metallic component which may be dissolved in the solid solution of the ceramic materials of the invention in order to modify performance or engineering characteristics of the ceramic material, without having any material impact on the overall phase and symmetry characteristics of the solid solution. For instance, dopants may be used to modify grain size and domain mobility, or to improve resistivity (e.g. by compensating for excess charge carriers), temperature dependence and fatigue properties.

Examples of suitable dopants include materials comprising a metallic cation, preferably selected from Mn, Mg, Nb and Ca, for example $MnO_2$, MgO, $Nb_2O_5$ and CaO. Preferably the solid solution ceramic materials of the invention contain less than 5 wt. %, preferably less than 2 wt. %, more preferably less than 0.5 wt. %, of dopant. In other preferred embodiments, the solid solution ceramic materials of the invention contain no dopant.

The solid solution ceramic materials comprise a single dominant crystalline phase, i.e. the ceramic material has a major portion of its microstructure (i.e. above 50 vol. %) which corresponds to a specific crystalline phase (e.g. a pseudo-cubic phase or tetragonal phase). Thus, in other words, where a solid solution ceramic material comprises multiple components in its microstructure, a single crystalline perovskite phase is present as the major proportion of the ceramic material's microstructure. Additional crystalline phases that may be present collectively represent a minor proportion of the ceramic material's microstructure. The lattice dimensions of the dominant crystalline phase, and the physical and chemical properties of the solid solution, are continuous functions of composition. The lattice symmetry may change within said composition range by uniform distortion of the structure as the composition changes. Preferably, the solid solution ceramic material is substantially homogeneous, having only a single crystalline phase.

It is desirable for the phase transition properties of the ceramic materials which are the subject of the present invention to be minimally affected across the range of pressures and temperatures over which field induced phase transition would be relied upon when applied to particular applications, such as actuator applications. The skilled person is able to determine particular temperature and pressure ranges over which a ceramic material is best operated to benefit from the characteristic field induced phase transition.

The solid solution ceramic materials which may be identified and prepared in accordance with the present invention may exhibit a phase stability over a large range of temperature (i.e. no temperature induced phase transition occurring over a large range of temperature). The ceramic materials may also undergo the field induced phase transition discussed herein over a large range of temperature. In preferred embodiments, the solid solution ceramic materials according to the present invention exhibit phase stability and are active for a field induced phase transition in accordance with the invention over a temperature range of from −50° C. to 200° C., more preferably from −5° C. to 150° C., still more preferably from 0° C. to 100° C.

Determining step i) in the above method may typically involve the selection of at least one tetragonal perovskite compound and at least one non-tetragonal perovskite compound and investigating how the properties of a solid solution of these particular perovskite compounds, in particular its symmetry under standard conditions (i.e. zero electric field, 25° C. and 1.01 bar (101 kPa)), and changes in properties depending on the mole fraction of the constituent perovskite compounds. For instance, one or more samples of solid solution ceramic materials of the combination of perovskites may be prepared before crystallographic properties are examined, for instance using XRD analysis, as described herein. This may be effectively used to verify that a particular mole ratio of the perovskite compounds affords a parent phase with the required tetragonal phase.

In addition, or alternatively, computer modeling software packages may be used to aid selection of the perovskite compounds associated with the parent phase based on known symmetry data for solid solutions of these perovskite compounds. Computer modeling may also be used to aid in predicting the crystallographic properties of a solid solution of a particular combination of perovskite compounds over different molar ratios of the compounds, thereby assisting in the determination of a suitable mole ratio of the perovskite compounds which affords a parent phase with the required tetragonal perovskite phase, or reducing the number of candidates that are selected for investigation. The skilled person is familiar with a number of open-source software packages that may be of use in this regard. For example, use may be made of molecular dynamics simulator software, such as the large-scale atomic/molecular massively parallel simulator (LAMMPS) from Sandia National Laboratories, in order to predict stability of solid solutions of different crystalline components. Alternatively or additionally, use may also be made of density functional theory (DFT) software, such as OpenMX.

Once a suitable mole ratio of the perovskite compounds has been determined in step i), determining step ii) may typically involve the selection of at least one additional non-tetragonal perovskite compound and investigating how the properties of a solid solution of this and the perovskite compounds from step i), in particular its symmetry under standard conditions (i.e. zero electric field, 25° C. and 1.01 bar (101 kPa)), changes depending on the mole fraction of the additional non-tetragonal perovskite compound. For instance, one or more samples of solid solution ceramic materials of the combination of perovskites may be prepared before crystallographic properties are examined, for instance using XRD analysis, as described herein. This may be effectively used to verify that a particular mole ratio of the perovskite compounds affords a solid solution ceramic material with the required pseudo-cubic perovskite phase.

In addition, or alternatively, computer modeling software packages may be used to aid selection of the additional non-tetragonal perovskite compound associated with the disorder phase based on known symmetry data for that perovskite compound and solid solutions of it with other perovskites. Computer modeling may also be used to aid in predicting the crystallographic properties of a solid solution of a particular combination of perovskite compounds over different molar ratios of the compounds, thereby assisting in the determination of a suitable mole ratio of the perovskite compounds which affords a solid solution ceramic material with the required pseudo-cubic phase perovskite phase, or reducing the number of candidates that are selected for investigation. Molecular dynamics simulator software and density functional theory (DFT) software discussed above may also be used in this regard.

Selection of the particular perovskite compounds of the parent and disorder phases is based on a selection of perovskite compounds which exhibit particular symmetry (i.e. tetragonal vs non-tetragonal) and which are dissimilar in terms of structure and/or electronic properties, as discussed hereinabove. Certain parameters can be used to facilitate this selection of parent and disorder phases. These are discussed in more detail below.

The method according to the above aspect of the present invention may therefore comprise sub-steps which are performed as part of determining steps i) and ii).

In some embodiments, step i) comprises the following sub-steps:
  i-a) preparing at least one solid solution ceramic material of at least one tetragonal perovskite compound and at least one non-tetragonal perovskite in a particular molar ratio;
  i-b) determining whether the axial ratio c/a for the major phase of the solid solution ceramic material prepared in step a) corresponds to a tetragonal phase having an axial ratio c/a of between 1.005 and 1.04.

Performance of sub-steps i-a) and i-b) may thus afford a solid solution ceramic material which exhibits the desired axial ratio c/a of 1.005 to 1.04. Alternatively, the axial ratio for the solid solution ceramic material prepared in sub-step i-a) may be outside the desired range. As will be appreciated, if that is the case, sub-steps i-a) and i-b) may be repeated.

Therefore, in some embodiments, step i) further comprises the following sub-step:
  i-c) repeating sub-steps i-a) and i-b) using a different molar ratio of the at least one tetragonal perovskite compound and at least one non-tetragonal perovskite until the axial ratio c/a for the major phase of the solid solution ceramic material prepared corresponds to a tetragonal phase having an axial ratio c/a of between 1.005 and 1.04.

Since the axial ratio of the solid solution ceramic material prepared in sub-step i-a) is dependent on the axial ratios of the at least one tetragonal perovskite compound and at least one non-tetragonal perovskite, a mole fraction of the two compounds can be readily determined by a person of skill in the art which provides the desired axial ratio in a solid solution of the perovskite compounds. Preferably, the at least one solid solution ceramic material prepared in sub-step i-a) includes the at least one tetragonal perovskite and the at least one non-tetragonal perovskite at a molar ratio of 3:1 to 1:3, preferably from 2:1 to 1:2, more preferably from 1.5:1 to 1:1.5.

In some embodiments, step ii) of the above method comprises the following sub-steps:
  ii-a) preparing at least one solid solution ceramic material of the at least one tetragonal perovskite compound and the at least one non-tetragonal perovskite compound at the molar ratio determined in step i) and additionally including at least one additional non-tetragonal perovskite compound in a particular molar ratio to the combination of perovskite compounds from step i); and
  ii-b) determining whether the axial ratio c/a and/or rhombohedral angle of the major phase of the at least one solid solution ceramic material prepared in step ii-a) corresponds to a pseudo-cubic phase having an axial ratio c/a of from 0.995 to 1.005 and/or a rhombohedral angle of 90±0.5 degrees.

Performance of sub-steps ii-a) and ii-b) may thus afford a solid solution ceramic material which exhibits the desired axial ratio c/a and/or rhombohedral angle characteristic of the pseudo-cubic phase. Alternatively, the axial ratio and/or rhombohedral angle for the solid solution ceramic material prepared in sub-step ii-a) may be outside the desired ranges. As will be appreciated, if that is the case, sub-steps ii-a) and ii-b) may be repeated.

Therefore, in some embodiments, step ii) further comprises the following sub-step:
  ii-c) repeating sub-steps ii-a) and ii-b) using a different molar ratio of the additional non-tetragonal perovskite compound to the combination of perovskite compounds from step i) until the axial ratio c/a and/or rhombohedral angle of the major phase of the resulting solid solution ceramic material corresponds to a pseudo-cubic phase having an axial ratio c/a of from 0.995 to 1.005 and/or a rhombohedral angle of 90±0.5 degrees.

Generally, it has been found that the molar ratio determined in step ii) of the method corresponds to a major mole fraction of the perovskite compounds associated with the parent phase and a minor mole fraction of the perovskite compound(s) associated with the disorder phase. In some embodiments, the at least one solid solution ceramic material prepared in sub-step ii-a) has the combination of perovskite compounds from step i) present in an amount of more than 50 mol. % of the ceramic material and has the at least one additional non-tetragonal perovskite compound in sub-step ii-a) present in an amount of less than 50 mol. % of the ceramic material.

In preferred embodiments, the at least one solid solution ceramic material prepared in sub-step ii-a) has the combination of perovskite compounds from step i) present in an amount of more than 80 mol. %, preferably more than 85 mol. %, more preferably more than 90 mol. %, of the ceramic material and has the at least one additional non-tetragonal perovskite compound in sub-step ii-a) present in an amount of less than 20 mol. %, preferably less than 15 mol. %, more preferably less than 10 mol. %, of the ceramic material.

In another aspect of the present invention, the parent phase may contain a tetragonal perovskite compound in the absence of a non-tetragonal perovskite compound.

Thus, in another aspect, the invention also provides a method of identifying a solid solution ceramic material of at least two perovskite compounds which exhibits an electric field induced strain derived from a reversible phase transition; said method comprising the steps of:
  1) selecting a tetragonal perovskite compound suitable for forming a ceramic material comprising a major portion of a tetragonal phase having an axial ratio c/a of between 1.005 and 1.04;
  2) determining a molar ratio of the tetragonal perovskite compound from step 1) to at least one non-tetragonal perovskite compound which, when combined to form a solid solution, provides a ceramic material comprising a major portion of a pseudo-cubic phase having an axial ratio c/a of from 0.995 to 1.005 and/or a rhombohedral angle of 90±0.5 degrees.

Selection step 1) in the above method may involve investigation of the properties of a ceramic material of the perovskite compound, in particular its symmetry under standard conditions (i.e. zero electric field, 25° C. and 1.01 bar (101 kPa)). For instance, one or more samples of ceramic materials of different tetragonal perovskites may be prepared before crystallographic properties are examined, for instance using XRD analysis, as described herein. This may be effectively used to verify that a particular tetragonal perovskite compound affords a parent phase with the required tetragonal phase. In addition, or alternatively, computer modeling software packages may be used to aid selection of the tetragonal perovskite compound associated with the parent phase based on known symmetry data for such perovskite compounds.

Once a suitable perovskite compound has been selected in step 1), determining step 2) may typically involve the selection of at least one additional non-tetragonal perovskite compound and investigating how the properties of a solid solution of this and the perovskite compound from step 1), in particular its symmetry, changes depending on the mole fraction of the additional non-tetragonal perovskite compound. For instance, one or more samples of solid solution ceramic materials of the combination of perovskites may be prepared before crystallographic properties are examined, for instance using XRD analysis, as described herein. This may be effectively used to verify that a particular mole ratio of the perovskite compounds affords a solid solution ceramic material with the required pseudo-cubic perovskite phase.

In addition, or alternatively, computer modeling software packages may be used to aid selection of the additional non-tetragonal perovskite compound associated with the disorder phase based on known symmetry data for that perovskite compound and solid solutions of it with other perovskites. Computer modeling may also be used to aid in predicting the crystallographic properties of a solid solution of a particular combination of perovskite compounds over different molar ratios of the compounds, thereby assisting in the determination of a suitable mole ratio of the perovskite compounds which affords a solid solution ceramic material with the required pseudo-cubic phase perovskite phase, or reducing the number of candidates that are selected for investigation. Molecular dynamics simulator software and density functional theory (DFT) software discussed above may also be used in this regard.

Selection of the particular perovskite compounds of the parent and disorder phases is based on a selection of perovskite compounds which exhibit particular symmetry (i.e. tetragonal vs non-tetragonal) and which are dissimilar in terms of structure and/or electronic properties, as discussed hereinabove. Certain parameters can be used to facilitate this selection of parent and disorder phases, as discussed in more detail below.

The above method of the present invention may comprise sub-steps which are performed as part of determining step 2).

Thus, in some embodiments, step 2) comprises the following sub-steps:
  2-a) preparing at least one solid solution ceramic material of the tetragonal perovskite compound and the at least one non-tetragonal perovskite compound at a particular molar ratio; and
  2-b) determining whether the axial ratio c/a and/or rhombohedral angle of the major phase of the at least one solid solution ceramic material prepared in step 2-a) corresponds to a pseudo-cubic phase having an axial ratio c/a of from 0.995 to 1.005 and/or a rhombohedral angle of 90±0.5 degrees.

Performance of sub-steps 2-a) and 2-b) may thus afford a solid solution ceramic material which exhibits the desired axial ratio c/a and/or rhombohedral angle characteristic of the pseudo-cubic phase. Alternatively, the axial ratio and/or rhombohedral angle for the solid solution ceramic material prepared in sub-step 2-a) may be outside the desired ranges. As will be appreciated, if that is the case, sub-steps 2-a) and 2-b) may be repeated.

Therefore, in some embodiments, step 2) further comprises the following sub-step:
  2-c) repeating sub-steps 2-a) and 2-b) using a different molar ratio of the tetragonal perovskite compound and the non-tetragonal perovskite compound until the axial ratio c/a and/or rhombohedral angle of the major phase of the resulting solid solution ceramic material corresponds to a pseudo-cubic phase having an axial ratio c/a of from 0.995 to 1.005 and/or a rhombohedral angle of 90±0.5 degrees.

Generally, it has been found that the molar ratio determined in step 2) of the method corresponds to a major mole fraction of the perovskite compound associated with the parent phase and a minor mole fraction of the perovskite compound(s) associated with the disorder phase. Therefore, in some embodiments, the at least one solid solution ceramic material prepared in sub-step 2-a) has the tetragonal perovskite compound from step 1) present in an amount of more than 50 mol. % of the ceramic material and has the at least one non-tetragonal perovskite compound in sub-step 2-a) present in an amount of less than 50 mol. % of the ceramic material.

In preferred embodiments, the at least one solid solution ceramic material prepared in sub-step 2-a) has the tetragonal perovskite compound present in an amount of more than 50 mol. %, preferably more than 65 mol. %, more preferably more than 75 mol. %, of the ceramic material and has the at least one non-tetragonal perovskite compound in sub-step 2-a) present in an amount of less than 50 mol. %, preferably less than 35 mol. %, more preferably less than 25 mol. %, of the ceramic material.

It will also be appreciated that other crystalline phases, aside from the desired pseudo-cubic phase, may be present in the microstructure of the ceramic materials prepared in accordance with the methods of the invention. However, these should collectively represent a minor proportion of the ceramic material's microstructure. In other words, the pseudo-cubic phase of the ceramic material corresponds to the major crystalline phase of the ceramic material (i.e. corresponding to greater than 50 vol. % of the ceramic material microstructure). In preferred embodiments the ceramic material comprises at least 70 vol. %, more preferably at least 80 vol. %, even more preferably at least 90 vol. %, most preferably at least 95 vol. % of the pseudo-cubic phase. In other preferred embodiments, the solid solution ceramic material is substantially homogeneous, having only a single crystalline phase.

The methods of the present invention may be employed to identify the mole ratios/mole fractions of constituent perovskite compounds in a solid solution ceramic material having a pseudo-cubic phase as the major crystalline phase and which is capable of reversibly transitioning from the pseudo-cubic phase to a tetragonal phase having an axial ratio c/a of between 1.005 and 1.04 on the application of electric field. The major crystalline phase of the ceramic material thus becomes the tetragonal phase following the field induced phase transition (i.e. greater than 50 vol. % of the ceramic material microstructure is tetragonal following the field induced phase transition).

Selection of Perovskite Compounds

In accordance with the methods of the present invention, perovskite compounds associated with parent and disorder phases are combined in a solid solution to form a perovskite structured ceramic material. Perovskite compounds may be represented by "$ABX_3$", where 'A' and 'B' are cations of different sizes, and X is an anion that bonds to both cations. As the skilled person is aware, the perovskite structure itself has the 'A' and 'B' cations arranged at particular sites, namely the A- and B-sites of the perovskite structure, respectively. In order to manipulate the symmetry exhibited by a perovskite ceramic material, different perovskite compounds may be combined in a solid solution.

As described hereinbefore, the parent phase contains at least one tetragonal perovskite compound and the disorder phase comprises at least one non-tetragonal phase compound. The at least one non-tetragonal perovskite compound may, for instance, be a perovskite compound with cubic, rhombohedral, orthorhombic or monoclinic symmetry. Where a non-tetragonal perovskite is also present in the parent phase, any of these forms of perovskite may be used, provided the axial ratio of the parent phase falls within the desired range. Similarly, any form of non-tetragonal compound can be utilised in the disorder phase, provided it is capable of providing a solid solution having the desired pseudo-cubic symmetry. Preferably, the non-tetragonal compound utilised in the disorder phase is a cubic perovskite compound.

In preferred embodiments, reference to at least one tetragonal perovskite compound (i.e. in the parent phase of the ceramic materials) includes materials having one or two tetragonal perovskite compounds, more preferably only a single tetragonal perovskite compound. In other preferred embodiments, where the parent phase additionally comprises at least one non-tetragonal perovskite compound, only a single non-tetragonal perovskite compound is preferably present. In further preferred embodiments, where at least one non-tetragonal perovskite compound (or at least one additional non-tetragonal perovskite compound) is present as applies to the disorder phase, one or two non-tetragonal perovskite compounds are present, more preferably only a single non-tetragonal perovskite compound The tetragonal perovskite compound utilised in the methods of the present invention are not specifically limited, provided they are suitable for forming the parent phase as set out above. Consequently, a range of cations may be employed in a tetragonal perovskite compound which may be of use in the present invention. Preferably, the tetragonal perovskite compounds utilised in accordance with the invention are lead-free.

Tetragonal perovskite compounds which are particularly suitable for use in accordance with the present invention comprise a metal cation selected from $Ti^{4+}$, $Zr^{4+}$, $Nb^{5+}$ and $Ta^{5+}$. Preferably, these cations are present in the B-site of the perovskite structure. Additionally, or alternatively, tetragonal perovskite compounds which are particularly suitable for use in accordance with the present invention comprise a metal cation which is $Ba^{2+}$, or a pair of charge compensated metal cations which is $Bi^{3+}_{0.5}K^{+}_{0.5}$ or $Bi^{3+}_{0.5}Na^{+}_{0.5}$. Preferably, these cations are present in the A-site of the perovskite structure.

In preferred embodiments, the tetragonal perovskite compound of use in accordance with the invention is selected from $(Bi_{0.5}K_{0.5})TiO_3$ and $BaTiO_3$.

As described above, the parent tetragonal phase, being that which is referred to in step i) or step 1) of the methods of the invention, has an axial ratio c/a of between 1.005 and 1.04. Preferably, the lower limit of this range of axial ratio c/a is at least 1.006, more preferably 1.008, and most preferably 1.01. A particularly preferred range of axial ratio c/a for the parent tetragonal phase is from 1.01 to 1.02.

The non-tetragonal perovskite compound(s) utilised in the methods of the present invention are not specifically limited, provided the compound(s) are suitable for forming the disorder phase and/or being present in the parent phase as set out above. Consequently, a range of cations can be employed in a non-tetragonal perovskite compound which may be of use in the present invention. Preferably, the non-tetragonal perovskite compound(s) utilised in accordance with the invention are lead-free.

Non-tetragonal perovskite compounds which are particularly suitable for use in the disorder phase (i.e. the at least one additional non-tetragonal perovskite compound in step ii), or the at least one non-tetragonal perovskite compound in step 2)) in accordance with the present invention, comprise a metal cation component with a filled valence electron shell, such as a metal cation selected from $Sr^{2+}$, $Ba^{2+}$ and $Ca^{2+}$. Preferably, the metal cation having a filled valence electron shell is in the A-site of the perovskite structure.

Alternatively or additionally, non-tetragonal perovskite compounds which are particularly suitable for use in the disorder phase (i.e. the at least one additional non-tetragonal perovskite compound in step ii), or the at least one non-tetragonal perovskite compound in step 2)) in accordance with the present invention, comprise a metal cation component with a non-filled valence electron shell, such as a metal cation selected from $Sn^{4+}$, $In^{3+}$, $Ga^{3+}$ and $Ni^{2+}$. Preferably, the metal cation having a non-filled valence electron shell is in the B-site of the perovskite structure.

In preferred embodiments, the non-tetragonal perovskite compound employed in the disorder phase (i.e. the at least one additional non-tetragonal perovskite compound in step ii), or the at least one non-tetragonal perovskite compound in step 2)), comprises a metal cation selected from $Sr^{2+}$, $Ba^{2+}$ and $Ca^{2+}$. Preferably, these cations are present on the A-site of the perovskite structure.

In other preferred embodiments, the non-tetragonal perovskite compound employed in the disorder phase (i.e. the at least one additional non-tetragonal perovskite compound in step ii), or the at least one non-tetragonal perovskite compound in step 2)) comprises a metal cation selected from $Hf^{4+}$ and $Zr^{4+}$. Preferably, these cations are present on the B-site of the perovskite structure.

In preferred embodiments, where a non-tetragonal perovskite compound is employed in the parent phase (corresponding to the at least one non-tetragonal perovskite compound employed in step i) in an aspect of the invention), the at least one non-tetragonal perovskite compound is selected from $(Bi_{0.5}Na_{0.5})TiO_3$ and $SrTiO_3$.

In some embodiments, the non-tetragonal perovskite compound employed in the disorder phase (i.e. the at least one additional non-tetragonal perovskite compound in step ii), or the at least one non-tetragonal perovskite compound in step 2)) is $SrHfO_3$ and/or $SrZrO_3$.

As described above, the disorder phase which is employed in the preparation of solid solution ceramic material in accordance with the invention, acts to disrupt the long range tetragonal order of the parent phase. This can be better achieved where the perovskite compound of the disorder phase is chemically dissimilar to the perovskite compound of the parent phase, in addition to exhibiting different symmetry. Thus, the perovskite compounds of the parent and disorder phases are preferably selected to be chemically dissimilar in order to enhance the benefits in terms of the properties of the resulting solid solution ceramic material.

Such chemical differences may be derived from differences in electronic structure, as well as valence, size and electronegativity of the ions of the perovskite compounds, which differences may be described by certain parameters, for example effective ionic charge, Shannon-Prewitt effective ionic radius, and Pauling electronegativity value. In selecting tetragonal and non-tetragonal perovskite compounds for use in the present invention, it is preferred that the metal cations occupying the A- and/or B-site in the tetragonal and non-tetragonal perovskite compounds are different. By selecting perovskite compounds based on these differences, selection of perovskite constituent compounds for use in the solid solution ceramic materials of the invention may be facilitated.

In some embodiments, the effective ionic charge of the metal cation occupying the A- and/or B-site of the tetragonal perovskite compound of the parent phase differs from that of the corresponding metal cation occupying the A- and/or B-site of the non-tetragonal perovskite of the disorder phase (i.e the additional non-tetragonal perovskite compound of step ii) or the at least one non-tetragonal perovskite compound in step 2) of the methods). Preferably, the difference in effective ionic charge is from 1 to 3.

In some embodiments, the Shannon-Prewitt effective ionic radius of the metal cation occupying the A and/or B site of the tetragonal perovskite compound of the parent phase differs from that of the corresponding metal cation occupying the A- and/or B-site of the non-tetragonal perovskite of the disorder phase (i.e the additional non-tetragonal perovskite compound of step ii) or the at least one non-tetragonal perovskite compound in step 2) of the methods). Preferably, the difference in Shannon-Prewitt effective ionic radius is from 5 to 25%.

In some embodiments, the Pauling electronegativity value of the element occupying the A- and/or B-site of the parent phase differs from that of the corresponding element occupying the A- and/or B-site of the disorder phase (i.e the additional non-tetragonal perovskite compound of step ii) or the at least one non-tetragonal perovskite compound in step 2) of the methods). Preferably, there is a Pauling electronegativity value difference of from 0.2 to 1.2.

Preparation of Solid Solution Ceramic Materials

Ceramic materials may be prepared by any suitable solid-state synthesis method of which the skilled person is familiar using the appropriate amounts of precursors, typically precursor oxides or carbonates. For example, for preparation of the solid solution of BNT-BKT-Sr(Hf,Zr)O$_3$ illustrated in FIG. 1, Bi$_2$O$_3$, TiO$_2$, Na$_2$CO$_3$, K$_2$CO$_3$, SrCO$_3$, ZrO$_2$, and HfO$_2$ starting powders of at least 99% purity may be utilised. In general, conventional solid state synthesis methods for making ceramic materials involve milling of the powder precursors, followed by shaping and calcining to produce the desired ceramic product. Milling can be either wet or dry type milling. High energy vibratory milling may be used, for instance, to mix starting powders, as well as for post-calcination grinding. Where wet milling is employed, the powders are mixed with a suitable liquid (e.g., ethanol or water, or combinations thereof) and wet milled with a suitable high density milling media (e.g., yttria stabilized zirconia (YSZ) beads). The milled powders are calcined, then mixed with a binder, formed into the desired shape (e.g., pellets) and sintered to produce a ceramic product with high sintered density.

For testing purposes, prior to electrical measurements, the ceramic disc may be polished to a suitable thickness (e.g., 0.9 mm), and a silver paste (e.g., Heraeus C1000) is applied to both sides of the discs. Depending upon the intended end use, a high-density ceramic disc or pellet may be polished to a thickness in the range of about 0.5 mm to about 1 mm.

The solid solution ceramic material may also be fabricated in the form of a thin film by any suitable deposition method. For example, atomic layer deposition (ALD), chemical vapor deposition (CVD) (including plasma-enhanced chemical vapor deposition (PECVD) and metalorganic chemical vapor deposition (MOCVD)), and chemical solution deposition (CSD) may be employed using appropriate precursors. Examples of suitable precursors include titanium (IV) isopropoxide, titanium butoxide, bismuth acetate, bismuth nitrate, bismuth 2-ethylhexanoate, barium acetate, barium nitrate, barium 2-ethylhexanoate, sodium acetate trihydrate, sodium nitrate, potassium acetate, potassium nitrate, magnesium acetate tetrahydrate, magnesium nitrate, zinc acetate and zinc nitrate. Suitable solvents that may be employed in these methods where appropriate include alcohols (for example, methanol, ethanol and 1-butanol) and organic acids (for example, acetic acid and propionic acid). Suitable stabilisers that may be employed in these methods where appropriate include acetylacetone and diethanolamine. Sputtering using solid state sintered or hot-pressed ceramic targets may also be employed, if desired. Such thin films may have a thickness in the range of from 0.3 μm to 5 μm, preferably in the range of from 0.5 μm to 3 μm.

Where the solid solution ceramic material is fabricated as a thin film, it will be appreciated that tensile stresses associated with the thin film can affect field-induced strains and the magnitude of the effective piezoelectric coefficient $d_{33}$*. The skilled person is able to determine the extent of residual tensile stresses associated with a fabricated thin film and take steps to control such stresses (for example, by utilising thermal anneals to relieve stress, by designing the device architecture to achieve a desired stress state, and by adjusting film thickness) in order to gain the maximum benefit of the field-induced strains associated with the solid solution ceramic materials of the present invention.

As will be appreciated, this approach can also, for instance, be utilised when the solid solution ceramic material is fabricated as a thin film forming part of an actuator component of a droplet deposition apparatus, described in further detail below. The skilled person is able to accommodate for, or mitigate, intrinsic stresses resulting from the configuration of the actuator component so as to ensure that the reversible phase transition associated with the ceramic material of the invention is possible in response to an electric field. Thus, as applied to the droplet deposition apparatus, the skilled person is able to ensure that the gain or loss of electric-field induced strain resulting from the reversible phase change caused by the application of an ejection waveform to an actuator element formed of the ceramic material is sufficient to cause ejection of a droplet. In one example, this might be accomplished by appropriate design of the ejection waveform. This may, for instance, include identifying a suitable amplitude for the ejection waveform (e.g. suitable peak-to-peak amplitude) and/or identifying suitable maximum and minimum voltage values (with the characteristic phase transition occurring upon change between maximum and minimum voltage values). The thus-designed ejection waveform may accommodate for, or mitigate, the effect that intrinsic stresses have on the conditions necessary to elicit the reversible phase transition.

In accordance with a further aspect, the present invention also provides a method of preparing a solid solution ceramic material of at least one tetragonal perovskite compound and at least two non-tetragonal perovskite compounds, wherein the ceramic material comprises a major portion of a pseudo-cubic phase having an axial ratio c/a of from 0.995 to 1.005 and/or a rhombohedral angle of 90±0.5 degrees; said method comprising the steps of:
I) mixing precursors for the perovskite compounds of the ceramic material in predetermined molar ratios; and
II) utilising the mixture of precursors formed in step I) in a solid-state synthesis to prepare the solid solution ceramic material;

wherein the predetermined molar ratios of precursors are determined based on: A) the molar ratio of precursors for the at least one tetragonal perovskite compound and at least one of the at least two non-tetragonal perovskite compounds required to form a solid state ceramic material having a major portion of a tetragonal phase having an axial ratio c/a of between 1.005 and 1.04; and B) the molar ratio of precursors for at least one of the at least two non-tetragonal perovskites to precursors for combination of perovskite compounds according to A) required to form a solid solution ceramic material having a major portion of the pseudo-cubic phase.

In accordance with yet a further aspect, the present invention also provides a method of preparing a solid solution ceramic material of at least one tetragonal perovskite compound and at least one non-tetragonal perovskite compounds, wherein the ceramic material comprises a major portion of a pseudo-cubic phase having an axial ratio c/a of from 0.995 to 1.005 and/or a rhombohedral angle of 90±0.5 degrees; said method comprising the steps of:
I) mixing precursors for the perovskite compounds of the ceramic material in predetermined molar ratios; and
II) utilising the mixture of precursors formed in step I) in a solid-state synthesis to prepare the solid solution ceramic material;

wherein the predetermined molar ratios of precursors are determined based on the molar ratio of precursors for the at least one tetragonal perovskite compound, wherein the tetragonal perovskite compound is suitable for forming a ceramic material comprising a major portion of a tetragonal phase having an axial ratio c/a of between 1.005 and 1.04, and the at least one non-tetragonal perovskite compound required to form a solid solution ceramic material having a major portion of the pseudo-cubic phase.

Preferably, the molar ratio of precursors in the above methods is derived from the molar ratio of perovskite compounds in the solid state ceramic material determined by the methods of identifying ceramic materials described hereinabove.

In still a further aspect, the present invention also provides a solid solution ceramic material obtainable, and preferably obtained, by the above methods.

In a yet further aspect, the present invention also provides a solid solution ceramic material of at least one tetragonal perovskite compound and at least one non-tetragonal perovskite compound, wherein the ceramic material is capable of exhibiting an electric field induced strain derived from a reversible phase transition from a pseudo-cubic phase having an axial ratio c/a of from 0.995 to 1.005 and/or a rhombohedral angle of 90±0.5 degrees to a tetragonal phase having an axial ratio c/a of between 1.005 and 1.04. As will be appreciated, the at least one tetragonal perovskite compound and/or the at least one non-tetragonal perovskite compound of the ceramic material may be as defined hereinabove. Additionally, the ceramic material may be a solid solution of at least three perovskite compounds (i.e. at least one tetragonal perovskite compound and at least two non-tetragonal perovskite compounds). In preferred embodiments, the solid solution ceramic material is lead-free.

The solid solution ceramic material which exhibits an electric field induced strain derived from a reversible phase transition from a pseudo-cubic phase to a tetragonal phase of in accordance with the invention preferably has a remanent polarisation of less than 5 $\mu C/cm^2$, as determined from polarisation hysteresis measurements at, for example, 1 Hz.

The solid solution ceramic material which exhibits an electric field induced strain derived from a reversible phase transition from a pseudo-cubic phase to a tetragonal phase in accordance with the invention preferably has an effective piezoelectric strain coefficient $d_{33}$* of from 50 to 500 pm/V. Reference to the effective piezoelectric coefficient ($d_{33}$*) herein refers to that which is determined from dividing the maximum electromechanical strain ($S_{max}$) by the maximum applied electric field ($E_{max}$) ($d_{33}$*=$S_{max}/E_{max}$).

The solid solution ceramic material which exhibits an electric field induced strain derived from a reversible phase transition from a pseudo-cubic phase to a tetragonal phase in accordance with the invention preferably has a maximum electromechanical strain value of from 0.1% to 0.5%, when measured at 10 Hz and at standard temperature and pressure (i.e. 25° C. and 1.01 bar (101 kPa)).

The solid solution ceramic material which exhibits an electric field induced strain derived from a reversible phase transition from a pseudo-cubic phase to a tetragonal phase of the invention preferably has a field induced polarisation of from 10 to 50 $\mu C/cm^2$, as determined from polarisation hysteresis measurements at, for example, 1 Hz.

Effective piezoelectric coefficient ($d_{33}$*), electromechanical strain response and polarisation hysteresis measurements may be measured using any suitable measurement device familiar to the skilled person, including, for example, an AixACCT Piezoelectric Characterization System fitted with an interferometer.

Ceramic materials which exhibit an electric field induced strain derived from a reversible phase transition that are the subject of the present invention, may be employed as actuating elements in a variety of actuator components. For instance, such an actuator component may find use in a droplet deposition apparatus. Droplet deposition apparatuses have widespread usage in both traditional printing applications, such as inkjet printing, as well as in 3D printing and other materials deposition or rapid prototyping techniques.

Thus, in another aspect, the present invention provides an actuator component for use in a droplet deposition apparatus comprising a ceramic material as defined above. In a related aspect, the present invention also provides a droplet deposition apparatus comprising the actuator component.

An actuator component suitable for use in a droplet deposition apparatus may, for instance, comprise a plurality of fluid chambers, which may be arranged in one or more rows, each chamber being provided with a respective actuator element and a nozzle. The actuating element is actuatable to cause the ejection of fluid from a chamber of the plurality through a corresponding one of the nozzles. The actuating element is typically provided with at least first and second actuation electrodes configured to apply an electric field to the actuating element, which is thereby deformed, thus causing droplet ejection. Additional layers may also be present, including insulating, semi-conducting, conducting, and/or passivation layers. Such layers may be provided using any suitable fabrication technique such as, for example, a deposition/machining technique, e.g. sputtering, CVD, PECVD, MOCVD, ALD, laser ablation etc. Furthermore, any suitable patterning technique may be used as required, such as photolithographic techniques (e.g. providing a mask during sputtering and/or etching).

The actuating element may, for example, function by deforming a wall bounding one of the fluid chambers of the actuator component. Such deformation may in turn increase the pressure of the fluid within the chamber and thereby cause the ejection of droplets of fluid from the nozzle. Such a wall may be in the form of a membrane layer which may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), titanium oxide ($TiO_2$), silicon (Si) or silicon carbide (SiC). The actuating element may include the ceramic material described herein in the form of a thin film. Such thin films may be fabricated, including in multiple layers, using different techniques well known to the skilled person, including sputtering, sol-gel, chemical solution deposition (CSD), aerosol deposition and pulsed laser deposition techniques.

The droplet deposition apparatus typically comprises a droplet deposition head comprising the actuator component and one or more manifold components that are attached to the actuator component. Such droplet deposition heads may, in addition, or instead, include drive circuitry that is electrically connected to the actuating elements, for example by means of electrical traces provided by the actuator component. Such drive circuitry may supply drive voltage signals to the actuating elements that cause the ejection of droplets from a selected group of fluid chambers, with the selected group changing with changes in input data received by the head.

To meet the material needs of diverse applications, a wide variety of alternative fluids may be deposited by droplet deposition heads as described herein. For instance, a droplet deposition head may eject droplets of ink that may travel to a sheet of paper or card, or to other receiving media, such as textile or foil or shaped articles (e.g. cans, bottles etc.), to form an image, as is the case in inkjet printing applications, where the droplet deposition head may be an inkjet printhead or, more particularly, a drop-on-demand inkjet printhead.

Alternatively, droplets of fluid may be used to build structures, for example electrically active fluids may be deposited onto receiving media such as a circuit board so as to enable prototyping of electrical devices. In another example, polymer containing fluids or molten polymer may be deposited in successive layers so as to produce a prototype model of an object (as in 3D printing). In still other applications, droplet deposition heads might be adapted to deposit droplets of solution containing biological or chemical material onto a receiving medium such as a microarray.

Droplet deposition heads suitable for such alternative fluids may be generally similar in construction to printheads, with some adaptations made to handle the specific fluid in question. Droplet deposition heads which may be employed include drop-on-demand droplet deposition heads. In such heads, the pattern of droplets ejected varies in dependence upon the input data provided to the head.

The present invention will now be described by reference to the following Examples which are intended to be illustrative of the invention and in no way limiting.

EXAMPLES

In the following examples, BKT was selected as the tetragonal perovskite compound for use in the method. BNT was selected as a non-tetragonal perovskite compound added to modify properties of the parent phase. $SrHfO_3$ and/or $SrZrO_3$ perovskite compounds were selected as non-tetragonal perovskite compounds for use as the disorder phase in the method of the invention. The solid solution ceramic materials prepared thus had the following chemical formula: $x(Bi_{0.5}Na_{0.5})TiO_3$-$y(Bi_{0.5}K_{0.5})TiO_3$-$z_1SrHfO_3$-$z_2SrZrO_3$, wherein $x+y+z_1+z_2=1$; x, y, $(z_1+z_2)\neq 0$.

General Method for the Preparation of Ceramic Materials

Appropriate amounts of $Bi_2O_3$, $TiO_2$, $Na_2CO_3$, $K_2CO_3$, $SrCO_3$, $ZrO_2$, and $HfO_2$ starting powders of at least 99% purity were utilised to make ceramic materials of a binary solid solution of BNT-BKT or a solid solution of BNT-BKT-Sr(Hf,Zr)$O_3$. The starting powders were mixed by means of high energy vibratory milling for a period of from two to six hours. Ethanol mixtures of the powders were prepared containing 15 vol. % powder and subsequently milled with high density yttria stabilised zirconia (YSZ) beads of approximately 3/8 inch (0.95 cm) diameter. After removal of YSZ beads by means of a sieving device, calcination was performed on the milled powder in covered crucibles at approximately 800-950° C. for 6 hours. High energy vibratory milling was subsequently used for post-calcination grinding of the powders from two to six hours.

The calcined powders were subsequently mixed with a 3 wt. % solution of polyvinyl butyral (PVB) binder, and the powders were uniaxially cold pressed into 12.7 mm pellets at a pressure of 150 MPa in a Carver press. Following a 400° C. binder burnout step, the pellets/discs were sintered in covered crucibles at 1000-1200° C. for 2 hours. The ceramic discs were polished to a thickness of 0.9 mm with smooth and parallel surfaces.

General Methods for Application of Electrodes to the Prepared Ceramic Materials

In a first method, silver paste (Heraeus C1000) was fired on both sides in air at 650° C. for 30 minutes.

In a second method, thin film electrodes of an inert metal such as Au, Ag, or Pt or the ceramic indium tin oxide (ITO) were applied to both sides of the specimen using DC magnetron sputtering in vacuum using standard methods.

Example 1—Investigating Suitable Parent Phase Composition

Multiple solid solution ceramic materials corresponding to a tetragonal parent phase comprising BKT as a tetragonal perovskite compound and BNT as a non-tetragonal perovskite compound were investigated, the ceramic materials differing on the basis of the mole fraction of BKT and BNT in the binary composition. Investigations identified a phase boundary between rhombohedral and tetragonal phases close to 80BNT-20BKT. However, a 50:50 mole fraction mixture of BNT and BKT was selected as it afforded a parent phase with the desired tetragonal phase symmetry and offered benefits as far as material fabrication are concerned. Based on investigations, the axial ratio c/a of a binary composition of BNT and BKT having a 1:1 molar ratio was believed to be 1.01.

Example 2—Investigating Suitable Disorder Phase Composition

Having identified an appropriate molar ratio of the tetragonal perovskite compound (BKT) and the non-tetragonal perovskite compound (BNT) for the parent phase (1:1 molar ratio), the above general method was used to prepare various ceramic materials having this ratio of perovskite compounds of the parent phase, with varying mole fraction of a disorder phase made up of additional non-tetragonal perovskite compound(s) ($SrHfO_3$ and/or $SrZrO_3$). The different solid solution ceramic materials prepared are as indicated in Table 1 below.

TABLE 1

| Ceramic Material Formula | | BNT mol. fraction (x) | BKT mol. fraction (y) | SrHfO$_3$ mol. fraction (z$_1$) | SrZrO$_3$ mol. fraction (z$_2$) |
|---|---|---|---|---|---|
| 1 | BNT-BKT- SrHfO$_3$ | 45 | 45 | 10 | 0 |
| 2 | BNT-BKT- SrZrO$_3$ | 45 | 45 | 0 | 10 |
| 3 | BNT-BKT- SrHfO$_3$—SrZrO$_3$ | 45 | 45 | 5 | 5 |
| 4 | BNT-BKT- SrHfO$_3$—SrZrO$_3$ | 46.5 | 46.5 | 3.75 | 3.75 |
| 5 | BNT-BKT- SrZrO$_3$ | 46.5 | 46.5 | 0 | 7.5 |
| 6 | BNT-BKT- SrHfO$_3$ | 47.5 | 47.5 | 5 | 0 |
| 7 | BNT-BKT- SrZrO$_3$ | 47.5 | 47.5 | 0 | 5 |
| 8 | BNT-BKT- SrHfO$_3$—SrZrO$_3$ | 47.5 | 47.5 | 2.5 | 2.5 |
| 9 | BNT-BKT- SrZrO$_3$ | 48.75 | 48.75 | 0 | 2.5 |
| 10 | BNT-BKT- SrHfO$_3$—SrZrO$_3$ | 48.75 | 48.75 | 1.25 | 1.25 |

Example 3—Identification of a Solid Solution Ceramic Material with a Pseudo-Cubic Phase X-ray diffraction analysis was completed for the ceramic materials prepared in Example 2 using Cu Kα radiation (Bruker AXS D8 Discover, Madison, Wis., USA) on ground pellets and analyzed for phase and crystal structure determination. Results in the form of XRD diffractograms are provided in FIGS. 2, 3a-b, 4 and 5a-b. For each of the ceramic materials 1 to 10 that were prepared, the XRD data reveal a single, homogeneous perovskite phase with pseudo-cubic symmetry, as desired. Therefore, the data demonstrate that a minor proportion of the disorder phase is sufficient for disrupting the long range tetragonal order of the parent phase.

Example 4—Assessment of Dielectric Properties of the Solid Solution Ceramic Materials Dielectric properties of the ceramic materials 6 to 8 from Example 2 were measured after the preparation of electrodes in accordance with the general methods set out above. The temperature dependence of relative permittivity and dielectric loss (tan δ) were measured at 1, 10, and 100 kHz using an HP 4194A LCR Meter. The results are presented in FIGS. 6a-c.

Figure 6A:
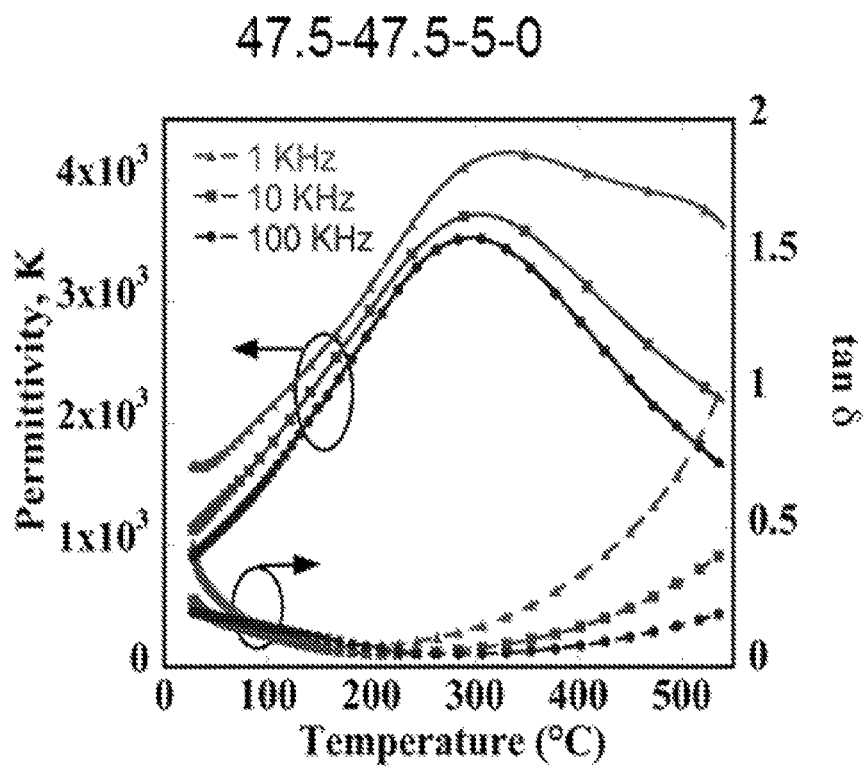
FIGS. 6a-c: show graphs of temperature dependence of relative permittivity and dielectric loss (tan δ) measured at 1, 10, and 100 kHz for BNT-BKT-SrHfO$_3$—SrZrO$_3$ ceramics having mole fractions of: a) 47.5-47.5-5-0; b) 47.5-47.5-0-5; and c) 47.5-47.5-2.5-2.5.
Figure 6B:
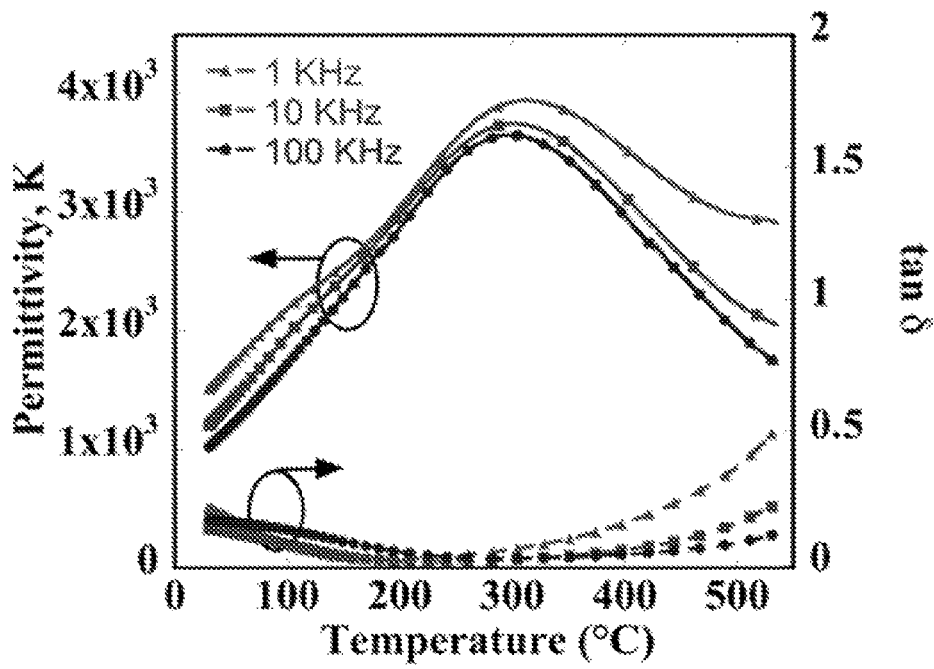
Figure 6C:
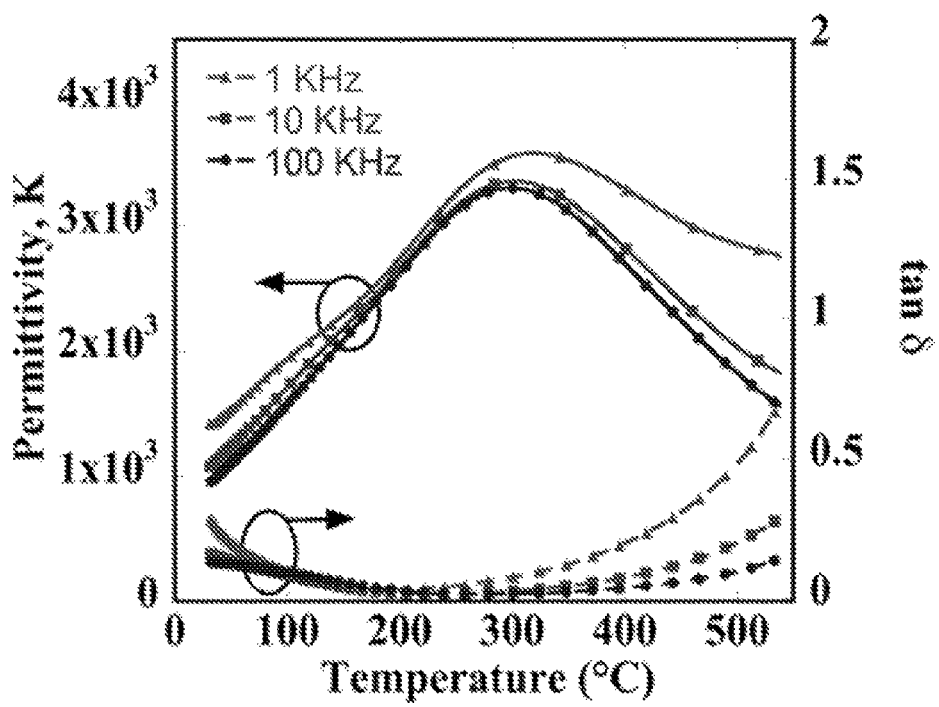
Figure 7A:
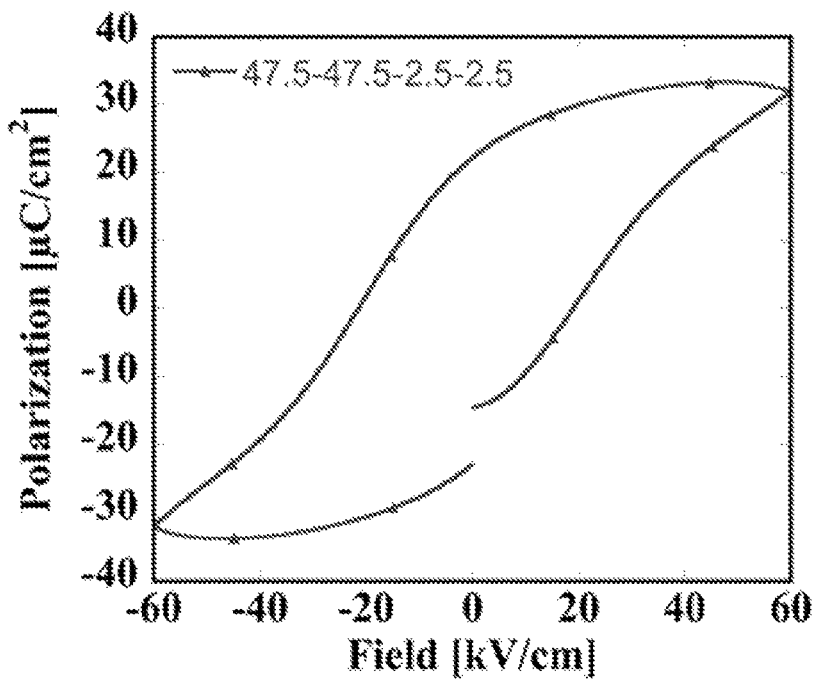
FIGS. 7a-c: show graphs of polarisation measured at 10 Hz and at room temperature (25° C.) versus electric field strength for BNT-BKT-SrHfO$_3$—SrZrO$_3$ ceramics having mole fractions of: a) 47.5-47.5-2.5-2.5; b) 47.5-47.5-5-0; and c) 47.5-47.5-0-5.
Figure 7B:
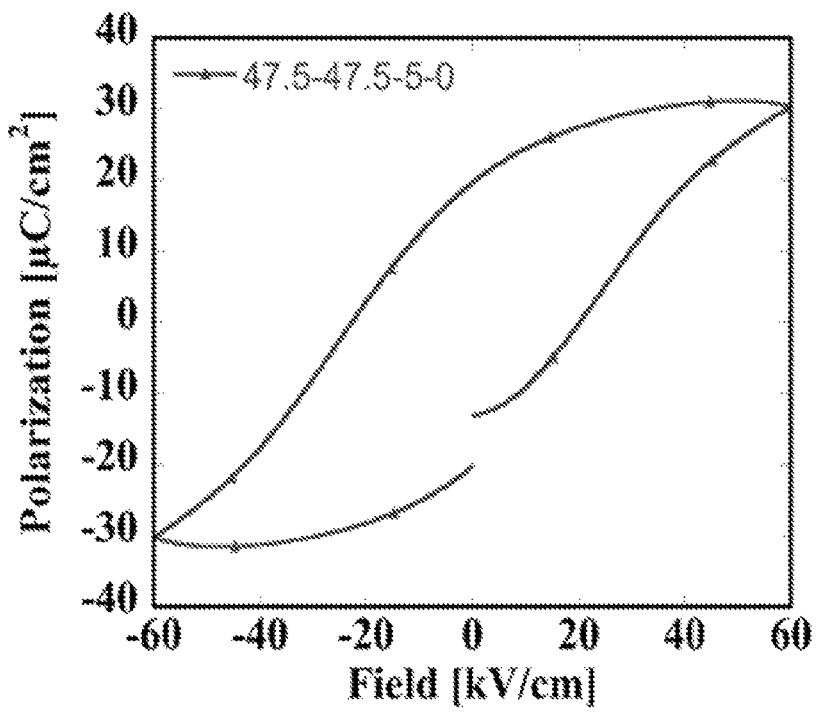
Figure 7C:
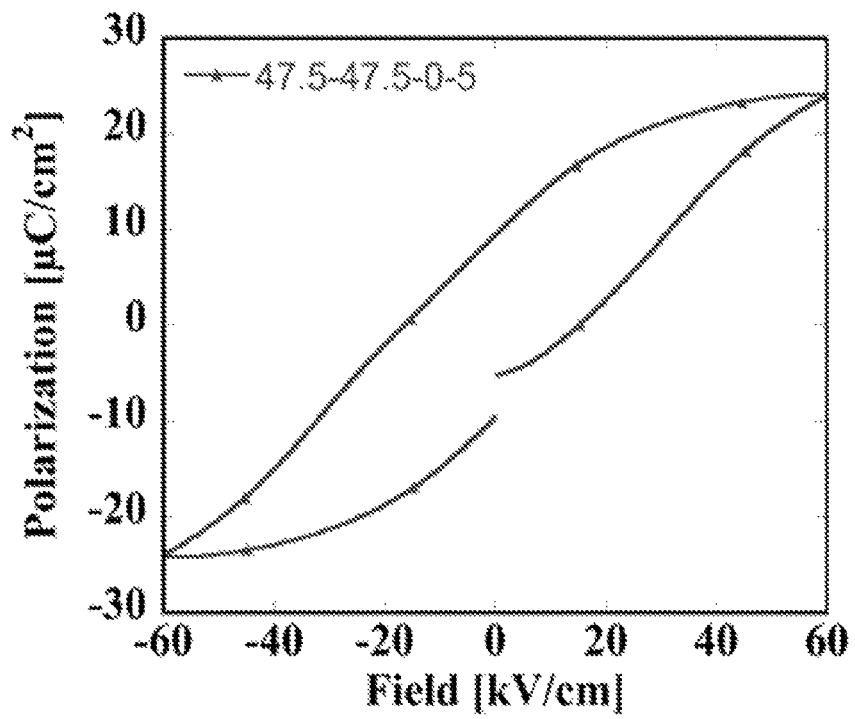

FIGS. 6a-c show a dielectric relaxation at low temperatures (T≤200° C.), and a dielectric maximum at approximately 300° C. ($T_{max}$). The low temperature dielectric relaxation can be attributed to the relaxor nature of the dielectric material. The BNT-BKT-SrHfO$_3$—SrZrO$_3$ ceramic materials are host to multiple cations with dissimilar sizes and electronic structures on the A-site (Bi, Na, K, Sr) and B-site (Ti, Zr, Hf). The dielectric maximum has been attributed to the change in short-range tetragonal distortions due to the local displacement of Ti on the B-site. At temperatures above 300° C. the Ti ion resides in a non-displaced position within the oxygen octahedra.

Example 5—Assessment of Polarisation Hysteresis Behaviour of the Solid Solution Ceramic Materials The polarisation hysteresis behaviour of ceramic materials 6 to 8 and 10 from Example 2 were measured after the preparation of electrodes in accordance with the general methods set out above. Polarisation was measured at 10 Hz at room temperature using an AixACCT Piezoelectric Characterization System. The results are presented in FIGS. 7a-c and 9a-b. These data show the characteristic non-linear hysteresis loop with maximum polarisation values between 20 and 30 μC/cm$^2$ and a remanent polarisation approaching zero, consistent with the ceramic material exhibiting relaxor-to-ferroelectric phase transition properties.

Example 6—Assessment of Electromechanical Strain Responses of the Solid Solution Ceramic Materials The electromechanical strain responses for ceramic materials 6 to 8 and 10 from Example 2 were measured after the preparation of electrodes in accordance with the general methods set out above. Electromechanical strain response was measured at 10 Hz at room temperature using an AixACCT Piezoelectric Characterization System fitted with an interferometer. The results are presented in FIGS. 8a-c and 10a-b.

Figure 8A:
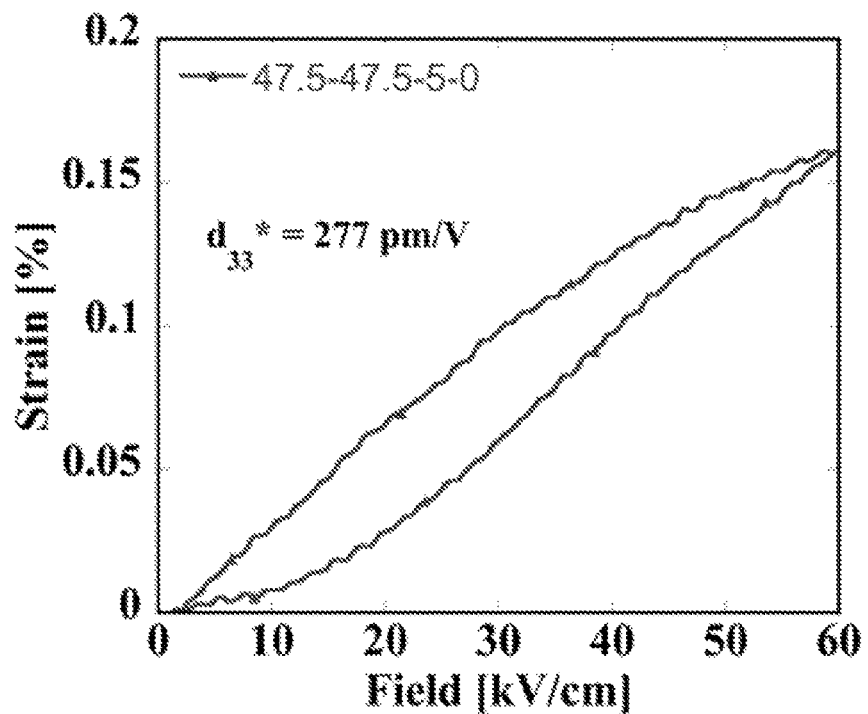
FIGS. 8a-c: show graphs of electromechanical strain measured at 10 Hz and at room temperature versus electric field strength for BNT-BKT-SrHfO$_3$—SrZrO$_3$ ceramics having mole fractions of: a) 47.5-47.5-5-0; b) 47.5-47.5-0-5; and c) 47.5-47.5-2.5-2.5.
Figure 8B:
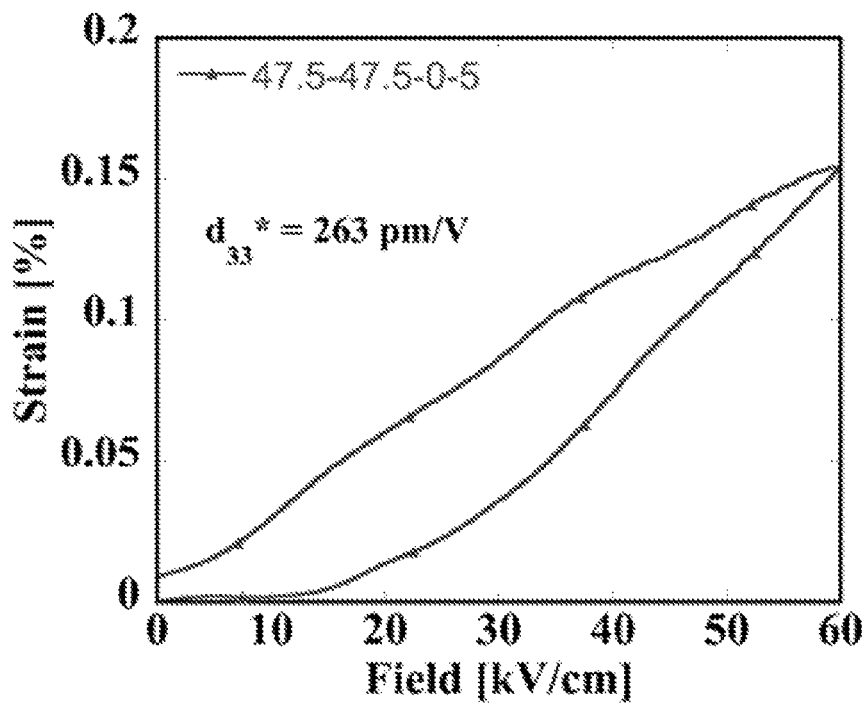
Figure 8C:
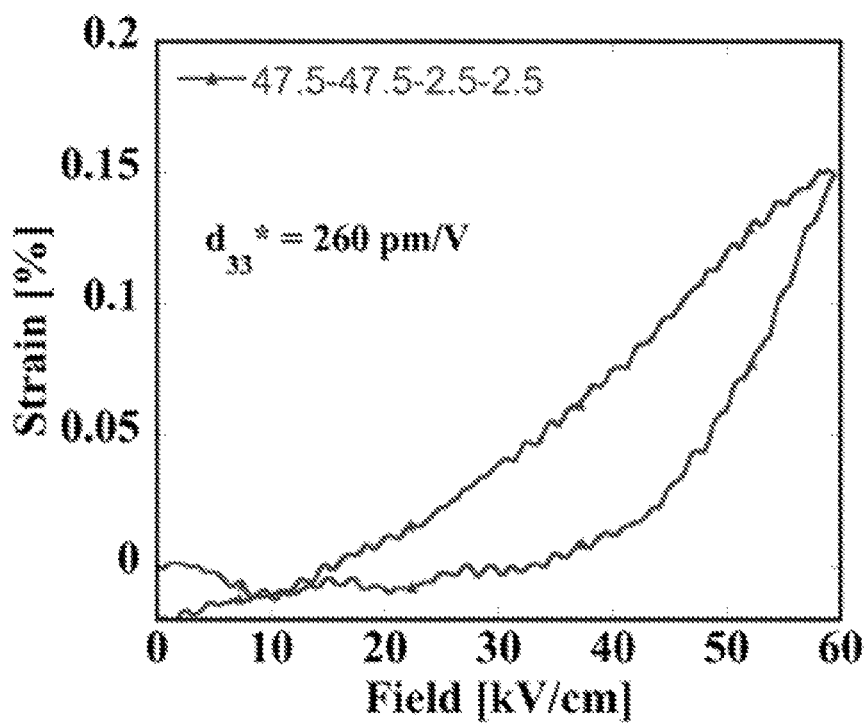
Figure 9A:
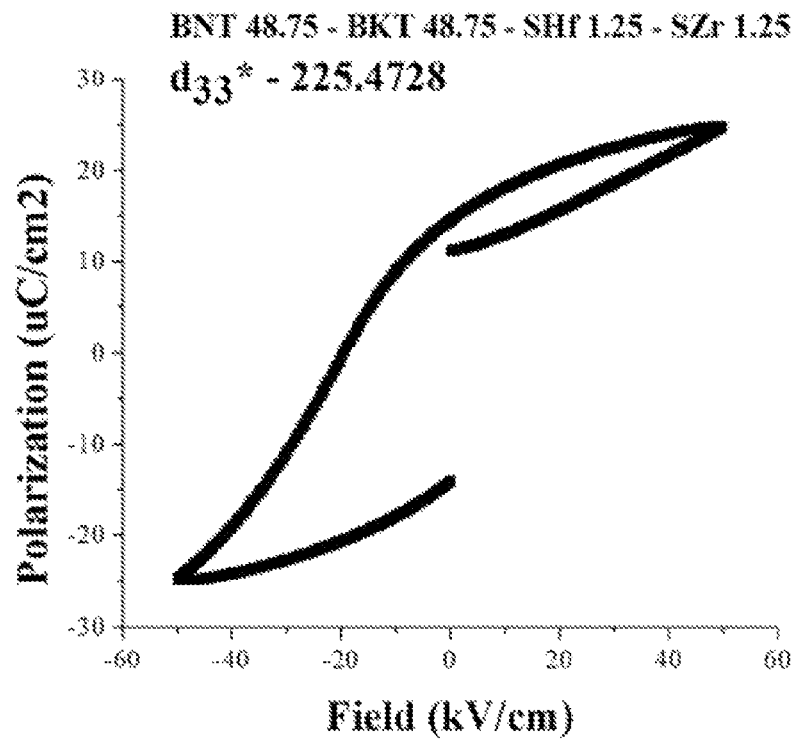
FIGS. 9a-b: show graphs of polarisation measured at 10 Hz and at room temperature versus electric field strength for BNT-BKT-SrHfO$_3$—SrZrO$_3$ ceramics having mole fractions of 48.5-48.5-1.25-1.25.
Figure 9B:
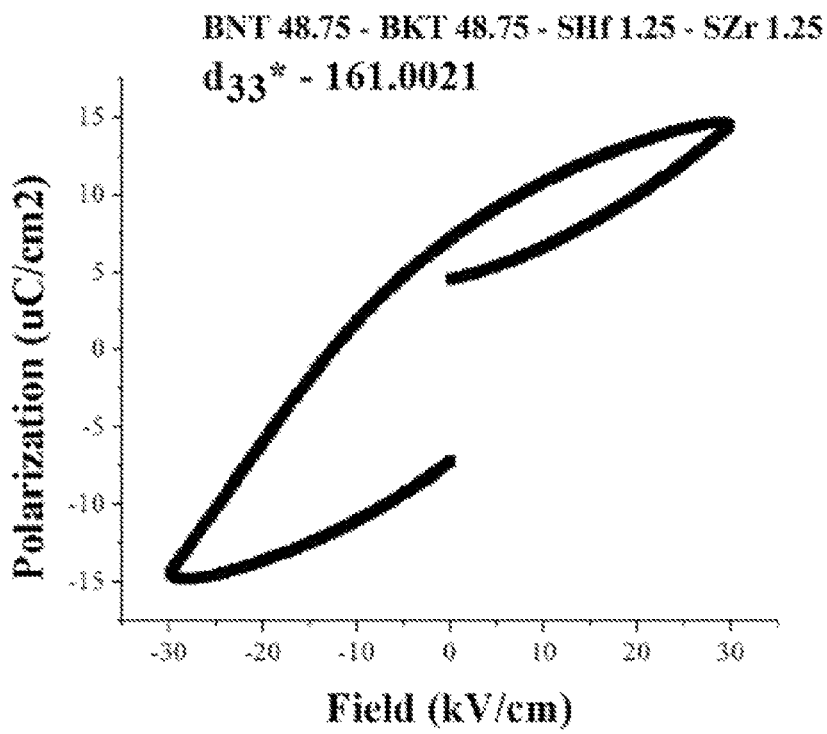
Figure 10A:
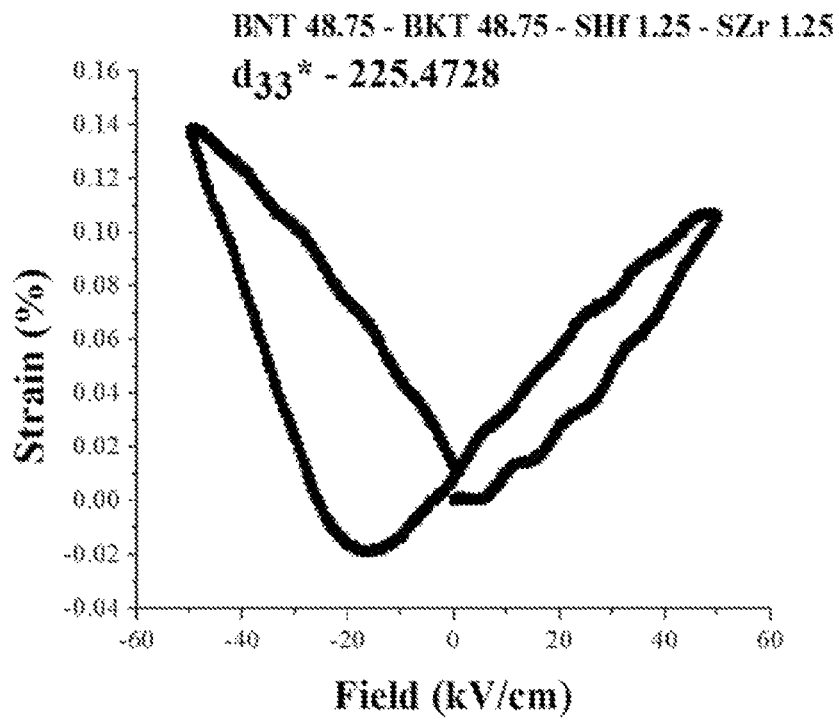
FIGS. 10a-b: show graphs of electromechanical strain measured at 10 Hz and at room temperature versus electric field strength for BNT-BKT-SrHfO$_3$—SrZrO$_3$ ceramics having mole fractions of 48.5-48.5-1.25-1.25.
Figure 10B:
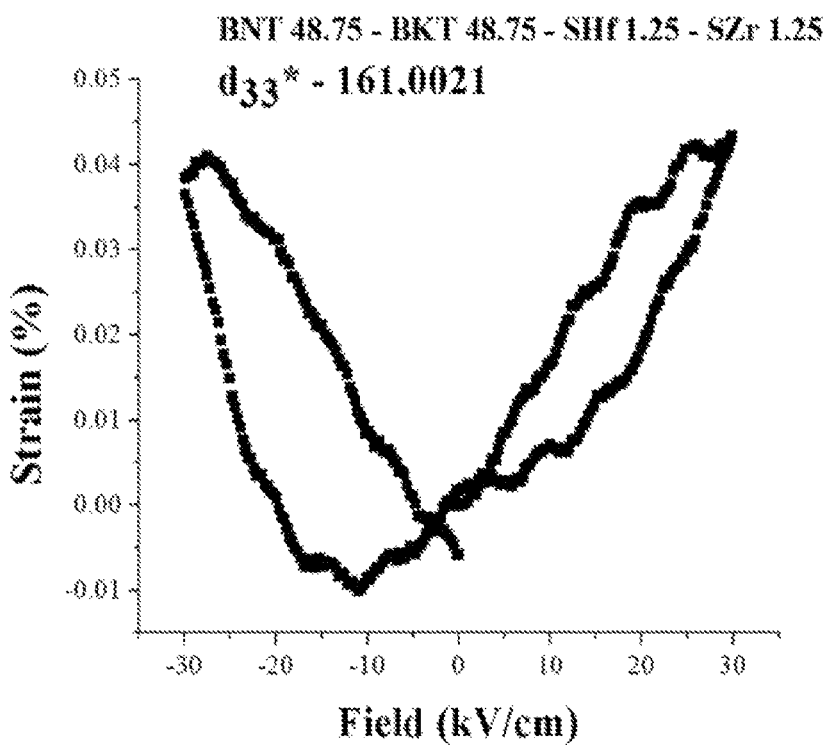

FIGS. 8a-c show maximum strains approaching 0.15% at a maximum electric field of 60 kV/cm. The effective piezoelectric coefficient ($d_{33}$*) for these ceramic materials (corresponding to ceramic materials 6 to 8 from Example 2) calculated from the maximum strain divided by the maximum electric field, had values ranging from 260 to 277 pm/V. The data show a quasi-parabolic strain with a moderate level of hysteresis. Both of these features are characteristic of materials that generate electromechanical strain through a relaxor-to-ferroelectric crossover mechanism, indicating a phase change from a pseudo-cubic, non-polar, phase to a tetragonal, ferroelectric, polar phase occurs, thereby giving rise to strain. These data demonstrate that these materials are highly suitable for actuator applications.

The invention claimed is:

1. A method of identifying a solid solution ceramic material of at least two perovskite compounds which exhibits a reversible phase transition induced by an electric field and a strain derived from the reversible phase transition; the method comprising steps of:
   1) selecting at least a tetragonal perovskite compound suitable for forming a ceramic material comprising a major portion of a tetragonal phase having an axial ratio c/a of between 1.005 and 1.04; and
   2) determining a molar ratio of the ceramic material from step 1) to at least one additional non-tetragonal perovskite compound which, when combined to form a solid solution, provides a ceramic material comprising a major portion of a pseudo-cubic phase having at least one of an axial ratio c/a from 0.995 to 1.005 or a rhombohedral angle of 90±0.5 degrees.

2. A method according to claim 1, wherein step 1) comprises selecting at least one tetragonal perovskite compound and at least one non-tetragonal perovskite compound and determining a molar ratio of at least one tetragonal perovskite compound to at least one non-tetragonal perovskite compound which, when combined to form a solid solution, provides a ceramic material comprising a major portion of a tetragonal phase having an axial ratio c/a of greater than 1.005 to 1.04.

3. A method according to claim 2, wherein step 1) comprises sub-steps of:
   1-a) preparing at least one solid solution ceramic material of at least one tetragonal perovskite compound and at least one non-tetragonal perovskite in a particular molar ratio; and
   1-b) determining whether the axial ratio c/a for the major phase of the solid solution ceramic material prepared in step 1-a) corresponds to a tetragonal phase having an axial ratio c/a of greater than 1.005 to 1.04.

4. A method according to claim 3, wherein step 1) further comprises a sub-step of:
   1-c) repeating sub-steps 1-a) and 1-b) using a different molar ratio of the at least one tetragonal perovskite compound and at least one non-tetragonal perovskite until the axial ratio c/a for the major phase of the solid solution ceramic material prepared corresponds to a tetragonal phase having an axial ratio c/a of greater than 1.005 to 1.04.

5. A method according to claim 3, wherein the at least one solid solution ceramic material prepared in sub-step 1-a) includes the at least one tetragonal perovskite and the at least one non-tetragonal perovskite at a molar ratio of 3:1 to 1:3.

6. A method according to claim 1, wherein step 2) comprises the following sub-steps:
   2-a) preparing at least one solid solution ceramic material comprising the ceramic material from step 1) and the at least one additional non-tetragonal perovskite compound at a particular molar ratio; and
   2-b) determining whether at least one of the axial ratio c/a or the rhombohedral angle of the major phase of the at least one solid solution ceramic material prepared in step 2-a) corresponds to a pseudo-cubic phase having at least one of an axial ratio c/a from 0.995 to 1.005 or a rhombohedral angle of 90±0.5 degrees.

7. A method according to claim 6, wherein step 2) further comprises the following sub-step:
   2-c) repeating sub-steps 2-a) and 2-b) using a different molar ratio of the ceramic material from step 1) and the additional non-tetragonal perovskite compound until at least one of the axial ratio c/a or the rhombohedral angle of the major phase of the resulting solid solution ceramic material corresponds to at least one of a pseudo-cubic phase having an axial ratio c/a from 0.995 to 1.005 or a rhombohedral angle of 90±0.5 degrees.

8. A method according to claim 6, wherein the at least one solid solution ceramic material prepared in sub-step 2-a) has the ceramic material from step 1), consisting of one tetragonal perovskite compound, present in an amount of more than 50 mol. %, and has the at least one non-tetragonal perovskite compound in sub-step 2-a) present in an amount of less than 50 mol. % of the ceramic material.

9. A method according to claim 6, wherein the at least one solid solution ceramic material prepared in sub-step 2-a) has the ceramic material from step 1), comprising a combination of perovskites, present in an amount of more than 80 mol. % of the ceramic material and has the at least one additional non-tetragonal perovskite compound in sub-step 2-a) present in an amount of less than 20 mol. of the ceramic material.

10. A method according to claim 2, wherein the at least one non-tetragonal perovskite compound in step 1) is at least one of a cubic, rhombohedral, orthorhombic or monoclinic perovskite compound.

11. A method according to claim 1, wherein
the tetragonal phase of the solid state ceramic material of step 1) has an axial ratio c/a from 1.01 to 1.02; and
the at least one additional non-tetragonal perovskite compound in step 2) is a cubic perovskite compound.

12. A method according to claim 1, wherein an effective ionic charge of a metal cation occupying at least one of an A-site or a B-site of the at least one tetragonal perovskite compound of step 1), differs from that of a corresponding metal cation occupying at least one of an A-site or B-site of the additional non-tetragonal perovskite compound in step 2).

13. A method according to claim 1, wherein the Shannon-Prewitt effective ionic radius of a metal cation occupying at least one of an A-site or B-site of the at least one tetragonal perovskite compound of step 1), differs from that of a corresponding metal cation occupying at least one of an A-site or B-site of the additional non-tetragonal perovskite compound in step 2).

14. A method according claim 1, wherein the Pauling electronegativity value of an element occupying at least one of an A-site or B-site of the at least one tetragonal perovskite compound of step 1), differs from that of a corresponding element occupying at least one of an A-site or B-site of the additional non-tetragonal perovskite compound in step 2).

15. A method according to claim 1, wherein the ceramic material of step 2) has a remnant polarization of less than 5 $\mu C/cm^2$.

16. A method according to claim 1, wherein the ceramic material of step 2) has a maximum electromechanical strain value from 0.1% to 0.5%, when measured at 10 Hz and at standard temperature and pressure.

17. A method according to claim 1, wherein the ceramic material of step 2) has a field induced polarization from 10 to 50 $\mu C/cm^2$.

18. A method of preparing a ceramic material comprising at least one tetragonal perovskite compound and at least one non-tetragonal perovskite compounds, the method comprising steps of:
   I) mixing precursors for the perovskite compounds of the ceramic material in predetermined molar ratios; and
   II) utilizing the mixture of precursors formed in step I) in a solid-state synthesis to prepare the solid solution ceramic material;
   wherein:
      the ceramic material comprises a major portion of a pseudo-cubic phase having at least one of an axial ratio c/a from 0.995 to 1.005 or a rhombohedral angle of 90±0.5 degrees;
      the predetermined molar ratios of the precursors are determined based on the molar ratio of the precursors for the at least one tetragonal perovskite compound, wherein the tetragonal perovskite compound is suitable for forming a ceramic material comprising a major portion of a tetragonal phase having an axial ratio c/a of between 1.005 and 1.04;
      the at least one non-tetragonal perovskite compound required to form the solid solution ceramic material has a major portion of the pseudo-cubic phase; and
      the at least one tetragonal perovskite compound and the at least one non-tetragonal perovskite compound exhibit a reversible phase transition induced by an electric field and a strain derived from the reversible phase transition.

19. A method according to claim 18, wherein the molar ratio of precursors is derived from the molar ratio of perovskite compounds in the solid state ceramic material.

20. A ceramic material, for use in an actuator, the ceramic material comprising of at least one tetragonal perovskite compound; and
at least one non-tetragonal perovskite compound,
wherein the ceramic material exhibits a reversible phase transition induced by an electric field and a strain derived from the reversible phase transition, wherein the reversible phase transition is from a pseudo-cubic phase having at least one of an axial ratio c/a from 0.995 to 1.005 or a rhombohedral angle of 90±0.5 degrees to a tetragonal phase having an axial ratio c/a of between 1.005 and 1.04.

* * * * *